United States Patent
Berman

[19]

[11] Patent Number: 6,009,257
[45] Date of Patent: Dec. 28, 1999

[54] COMPUTER SYSTEM AND COMPUTER IMPLEMENTED METHOD FOR GENERATING, DISPLAYING AND SIMULATING A HIERARCHICAL MODEL HAVING CROSS-BRANCH CONNECTIONS USING MULTIPLICITY TREES

[75] Inventor: Jeremy S. Berman, St. Louis Park, Minn.

[73] Assignee: NCR Corporation, Dayton, Ohio

[21] Appl. No.: 08/958,353

[22] Filed: Oct. 27, 1997

[51] Int. Cl.$^6$ ............................ G06F 19/00; G05B 17/00
[52] U.S. Cl. .................... 395/500.34; 395/500.38
[58] Field of Search ............................ 364/578, 488–491; 395/500, 500.34, 500.38

[56] References Cited

U.S. PATENT DOCUMENTS

| | | | |
|---|---|---|---|
| 4,965,743 | 10/1990 | Mallin et al. | 364/578 |
| 5,598,532 | 1/1997 | Liron | 364/488 |
| 5,610,833 | 3/1997 | Chang et al. | 364/491 |
| 5,715,432 | 2/1998 | Xu et al. | 395/500 |

*Primary Examiner*—Kevin Teska
*Assistant Examiner*—Kyle J. Choi
*Attorney, Agent, or Firm*—Lowe Hauptman Gopstein Gilman & Berner, LLP

[57] ABSTRACT

A method and system of providing an interactive user interface for a user to specify one or more familial relationships between regions includes inputting, by the user, a network model including one or relationships within at least one of the regions and/or across at least two of the regions. The user defines at least one multiplicity relationship for the network model, including one or more familial relationships within the regions and/or across the regions using one or more familial indices. The computer simulates the network model, and outputs simulation results responsive thereto.

10 Claims, 31 Drawing Sheets

DETAILED TREE

MULTIPLICITY TREE

DETAILED TREE

DETAILED TREE

MULTIPLICITY TREE

DETAILED TREE

MULTIPLICITY TREE

MULTIPLICITY TREE

CONCISE NETWORK

MULTIPLICITY TREE

CONCISE NETWORK

MULTIPLICITY TREE

CONCISE NETWORK

MULTIPLICITY TREE

CONCISE NETWORK

MULTIPLICITY TREE

CONCISE NETWORK

MULTIPLICITY TREE

CONCISE NETWORK

MULTIPLICITY TREE

CONCISE NETWORK

MULTIPLICITY TREE

CONCISE NETWORK

MULTIPLICITY TREE

CONCISE NETWORK

MULTIPLICITY TREE

CONCISE NETWORK

DETAILED NETWORK

MULTIPLICITY TREE

CONCISE NETWORK

MULTIPLICITY TREE

CONCISE NETWORK

COMPUTER SYSTEM AND COMPUTER IMPLEMENTED METHOD FOR GENERATING, DISPLAYING AND SIMULATING A HIERARCHICAL MODEL HAVING CROSS-BRANCH CONNECTIONS USING MULTIPLICITY TREES

RELATED APPLICATIONS

The present invention is related to U.S. patent application Ser. No. 08/641,599, filed on May 1, 1996, entitled "Systems and Methods for Modeling a Network", and U.S. patent application Ser. No. 08/656,122, filed on May 30, 1996, entitled "Systems and Methods for Generating and Displaying a Symbolic Representation of a Network Model," both of which are commonly assigned to the assignee of the present application, and which are incorporated herein by reference.

BACKGROUND OF THE INVENTION

1. Field of the Invention

The present invention is generally related to computer systems and methods of modeling hierarchically designed entities, and more specifically, to computer systems and computer implemented methods of generating, displaying and simulating a hierarchical model having cross-branch connections using multiplicity trees to represent, for example, a network model.

2. Background of the Related Art

Modern day entities and/or networks (e.g., communication networks, physical networks such as neural networks, organizational networks, and the like) are extremely complex. They are often distributed over great distances and typically consist of many, possibly even thousands of nodes. For modeling purposes, the configurations may often be adequately described in but a few phrases or sentences.

For example, in a network example, a wide area network ("WAN") used by a convenience store chain of 100 stores may suitably be described as including a processing hub in each store, each hub connected via the WAN to a processing center and having fifty attached workstations; wherein each of the workstations accesses a common application program and is operative to send in 100-byte requests and receive back 1000 byte responses. Such a description shows that there are actually only a small number of network elements to be described, although there may exist a large multiplicity of some of these elements (e.g., instances, plurality, multitude, multiformity, several, etc.).

Conventional modeling tools fail to exploit the simplicity of the above description. In point of fact, conventional modeling tools have very limited capacity to reduce the drawing complexity. They require one to draw all 100 hubs, and report on hub utilizations only one at a time. For many modeling tools, the same is true for the 5000 workstations as well.

An important use of modeling tools is to design and tailor a entity and/or network to a user's particular needs. The model should explore many possible combinations of, for example, structure, link speeds, router capacities, message rates, links and router quantities, and the like, in a search for a "best fit" to a user's needs. A fast and efficient means of modeling and displaying an entity, and a concise report on simulation of the entity is needed. Unfortunately, conventional modeling techniques used in modeling tools are too cumbersome to accomplish the foregoing.

I have discovered that presently available modeling tools suffer from a common ailment—specifically, they fail to recognize symmetries and element groupings associated with an entity and/or network. The occurrence and recognition of these typical symmetries and common groupings may suitably reduce the description necessary for a complete model, thereby improving the power and efficiency of the modeling tool.

Accordingly, there exists a need in the art for a modeling tool that recognizes symmetries and common groupings of elements in a proposed entity and/or network, and uses the same to provide a simplified representation of the entity and/or network.

There exists a further need in the art for a modeling tool that easily modifies, or reconfigures, a model without substantially redefining the entire representation of the entity and/or network.

There exists a still further need in the art for a modeling tool that provides a concise pictorial representation of the entity, as well as a report on the performance of the entity, elements and common groups of elements within the entity.

There exists a still further need in the art for a modeling tool that provides a simplified representation of the entity and/or network with arbitrary familial relationships between nodes and/or regions in an entity and/or network.

SUMMARY OF THE INVENTION

To overcome the above-detailed disadvantages and shortcomings of the prior art, it is an object of the present invention to provide, in a graphical user interface ("GUI") environment, an interactive user interface by which a user may simplify the generation and display of an entity and/or network model on a display device.

In the attainment of the same, the present invention provides a method of generating, displaying, and/or simulating a model on a display device of a computer system, a computer system employing the method, a computer readable memory storing the medium, and a method for representing a model in a memory.

It is therefore a feature and advantage of the present invention to provide a modeling tool that recognizes symmetries and common groupings of elements in a proposed entity and/or network, and uses the same to provide a simplified representation of the entity and/or network.

It is another feature and advantage of the present invention to provide a modeling tool that easily modifies, or reconfigures a model without substantially redefining the entire representation of the entity and/or network.

It is another feature and advantage of the present invention to provide a modeling tool that provides a concise pictorial representation of the entity, as well as a report on the performance of the entity, elements and common groups of elements within the entity.

It is another feature and advantage of the present invention to provide a modeling tool that provides a simplified representation of the entity and/or network with connections having arbitrary familial relationships between their end nodes and/or regions in an entity and/or network.

In accordance with one embodiment of the invention, a method and system of providing an interactive user interface for a user to specify connections having one or more familial relationships between regions includes inputting, by the user, a network model including one or more relationships within at least one of the regions and/or across at least two of the regions. The user defines at least one multiplicity relationship for the network model, including one or more connections having familial relationships within the regions and/or across the regions using one or more familial indices. The computer simulates the network model, and outputs simulation results responsive thereto.

A computer memory stores, and a computer executes, a program including the above process steps.

BRIEF DESCRIPTION OF THE DRAWINGS

For a more complete understanding of the present invention and the advantages thereof, reference is now made to the following descriptions taken in conjunction with the accompanying drawings in which like numbers designate like parts, and in which.

NOTATIONS AND NOMENCLATURE

The detailed descriptions which follow may be presented in terms of program procedures executed on a computer or network of computers. These procedural descriptions and representations are the means used by those skilled in the art to most effectively convey the substance of their work to others skilled in the art.

A procedure is here, and generally, conceived to be a self-consistent sequence of steps leading to a desired result. These steps are those requiring physical manipulations of physical quantities. Usually, though not necessarily, these quantities take the form of electrical or magnetic signals capable of being stored, transferred, combined, compared and otherwise manipulated. It proves convenient at times, principally for reasons of common usage, to refer to these signals as bits, values, elements, symbols, characters, terms, numbers, or the like. It should be noted, however, that all of these and similar terms are to be associated with the appropriate physical quantities and are merely convenient labels applied to these quantities.

Further, the manipulations performed are often referred to in terms, such as adding or comparing, which are commonly associated with mental operations performed by a human operator. No such capability of a human operator is necessary, or desirable in most cases, in any of the operations described herein which form part of the present invention; the operations are machine operations. Useful machines for performing the operation of the present invention include general purpose digital computers or similar devices.

The present invention also relates to apparatus for performing these operations. This apparatus may be specially constructed for the required purpose or it may comprise a general purpose computer as selectively activated or reconfigured by a computer program stored in the computer. The procedures presented herein are not inherently related to a particular computer or other apparatus. Various general purpose machines may be used with programs written in accordance with the teachings herein, or it may prove more convenient to construct more specialized apparatus to perform the required method steps. The required structure for a variety of these machines will appear from the description given.

BEST MODE FOR CARRYING OUT THE INVENTION

Computer networks may consist of hundreds of nodes and thousands of terminals. In the related co-pending patent applications, incorporated previously herein by reference, I showed how such a network could be represented in a computer program using only a small number of elements having repetition factors called multiplicities. From now on, I will refer to this patent application as "the previous application."

Figure 1A:
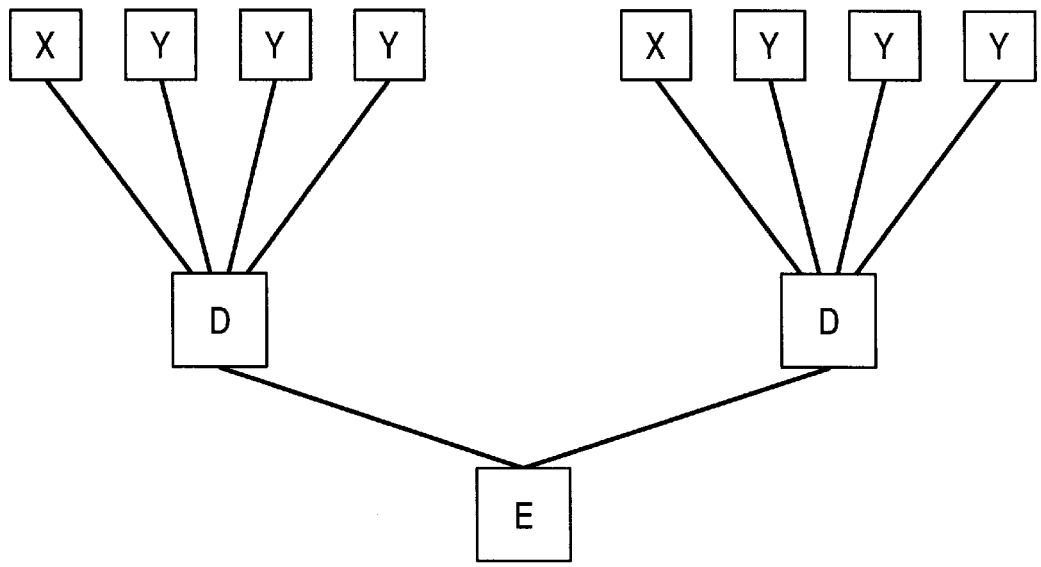
FIG. 1A is an illustration of a detailed tree illustrating an exemplary entity and/or network with connections (physical and/or logical) between elements having a direct tree relationship and/or connection.
Figure 1B:
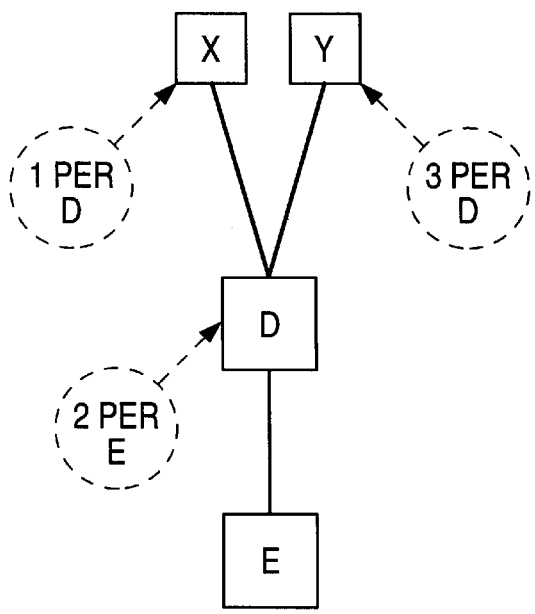
FIG. 1B is an illustration of a multiplicity tree describing the detailed tree illustrated in FIG. 1A.

Networks defined via the previous disclosure are in tree and/or hierarchical form. A simple example is illustrated in FIGS. 1A–1B. The user draws the tree illustrated in FIG. 1B, and defines the multiplicity relationships. For example, the user specifies that there is one X per D, and three Y's per D, while there are three D's per E. FIG. 1A is the resulting detailed tree network.

If the X's and Y's represent work stations, the previous application would allow them to have connections (physical or logical) only with respect to elements lower on the tree than themselves. For example, the left most X could talk to the left most D, and the right most X could talk to the right most D, but it couldn't have the "cross talk" of the left X talking to the right D and the right X talking to the left D. What was not allowed and/or contemplated in the previous application, were "cross-branch connections", i.e., connections that jump from one branch of the tree to another. Also, the X's and Y's could not communicate with each other, nor could any X talk to another X, nor a Y talk to another Y.

The present invention allows all of these additional types of communication. I allow elements on one branch of the detailed tree to talk to elements on another branch, and still provide a notational scheme, and/or user interface to facilitate the design of same.

Distinguishing between family relationships

Let us think of each of the D nodes as children of E, who is their parent. The two D nodes are "brothers". Each D node has four children, one X and three Y's. Those four children are brothers to each other. However, the children of the left D node are "cousins" to the children of the right D node.

Now suppose I wish to set up sessions between Y entities of FIGS. 1A–1B. The method to be described allows the definition of one kind of such connection between pairs of Y's who are brothers to each other, and another kind between pairs of Y's who are cousins to each other. Similar remarks apply to connections between pairs consisting of an X and a Y.

This distinction has practical benefits. Suppose that all of the children of a D node are within one mile of each other, but the two D nodes are 100 miles apart. We might expect that a connection between brothers, located close to each other, might have different characteristics than a connection between cousins, who are far apart from each other. The notation to be described herein enables this distinction. We may also distinguish between talking to one's father and one's uncle.

Figure 2:
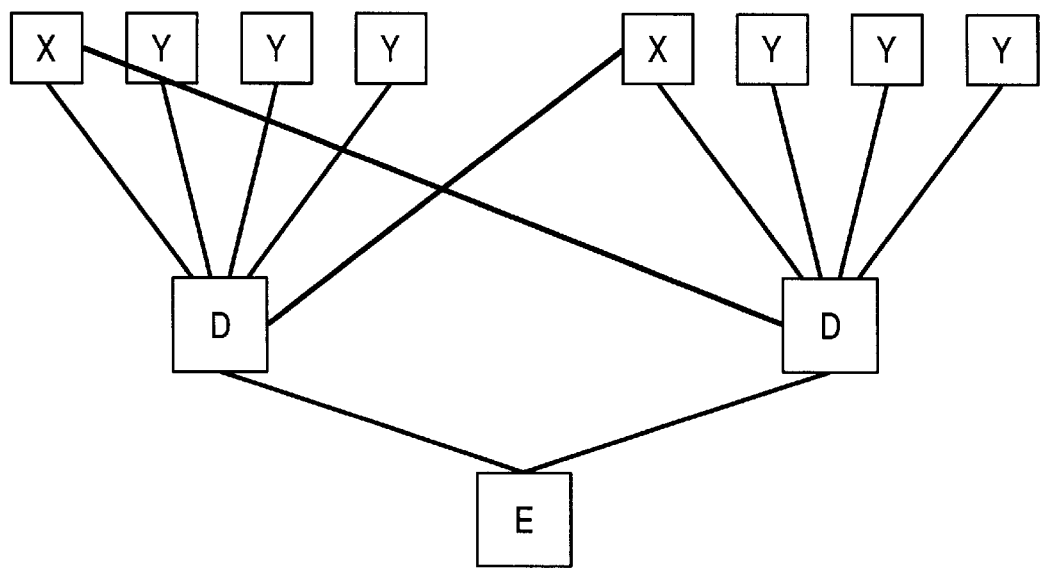
FIG. 2 is an illustration of a detailed tree illustrating an exemplary entity and/or network with connections (physical and/or logical) between elements having arbitrary familial relationships.

Consider the following connections, mentioned above, and illustrated in FIG. 2. Here, we have pictured each X talking to its uncle (the cousin of its father), instead of to its father. In general, the extended method described herein allows one to specify connections between entities that have arbitrary familial relationships (great-uncles etc.) In the previous application, an entity could only talk to a direct descendant or an ancestor. This is just another way of saying that formerly, connections were generally confined to a single branch of the detailed tree, and now they are not.

Figure 3A:
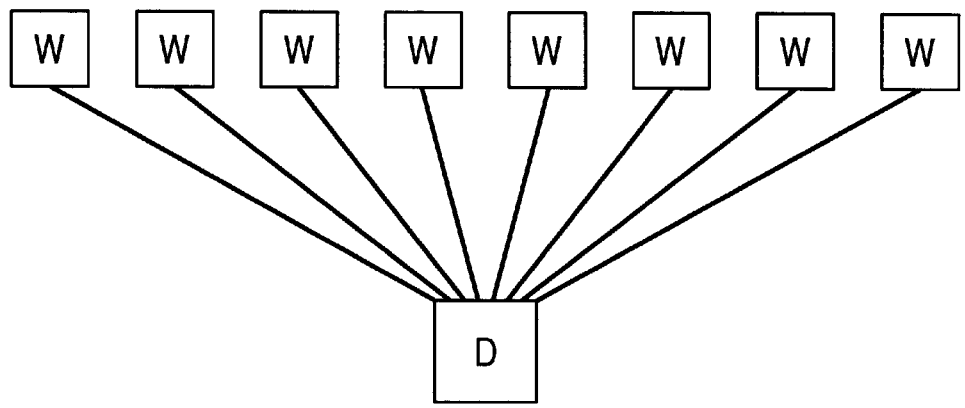
FIG. 3A is an illustration of a first simplified detailed tree illustrating an exemplary entity and/or network with connections (physical and/or logical) between elements having a direct tree relationship and/or connection.
Figure 3B:
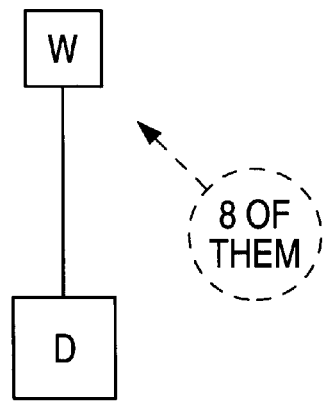
FIG. 3B is an illustration of a multiplicity tree describing the detailed tree illustrated in FIG. 3A.

Consider the network illustrated in FIGS. 3A–3B, suppose that D is an ATM switch, having eight ports. Each port terminates in a W. If we wish to use a simulation model to test the performance of the switch, we ought to stress test it by have traffic passing between every pair of ports. This means that traffic should pass between each of the pairs of W's. The sessions so defined would then be between brothers, and all of these sessions would have end points on different branches of the tree.

Figure 4A:
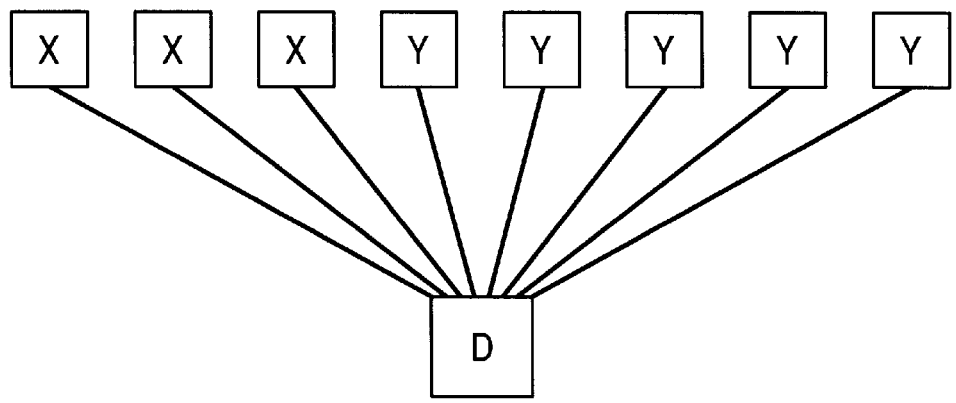
FIG. 4A is an illustration of a second simplified detailed tree illustrating an exemplary entity and/or network with connections (physical and/or logical) between elements having a direct tree relationship and/or connection.
Figure 4B:
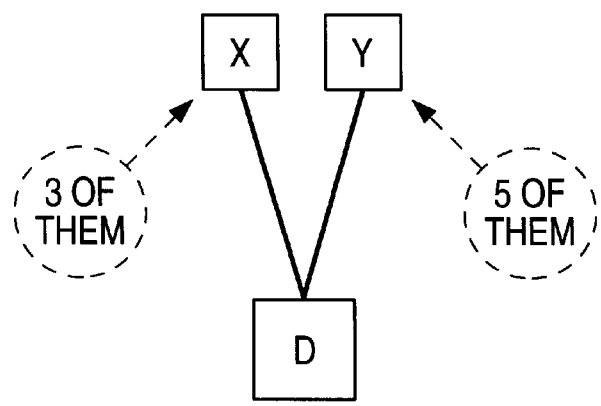
FIG. 4B is an illustration of a multiplicity tree describing the detailed tree illustrated in FIG. 4A.

Alternatively, we might like to test some more restricted kinds of traffic, such as illustrated in FIGS. 4A–4B. Here we want each of the three X's talking to each of the five Y's (15 conversations in all). This would test the capacity of the switch against a different type of load.

A more general approach

In FIGS. 1A–1B, the "boxes" X, Y, D, E all represented single entities such as work stations, routers, etc. In the more general approach, those "boxes" are called "regions" and consist of possibly several entities. In particular, in the previous application, the root region consisted of many entities, and it is mentioned that other regions could likewise have many entities in them. In what follows, I take this more general point of view.

I have departed from the assumptions of the previous application as follows: in the previous application, a region could consist of links as well as nodes. According to the present invention, regions generally consist solely of nodes. The precise definitions for the present invention are now described.

Figure 5:
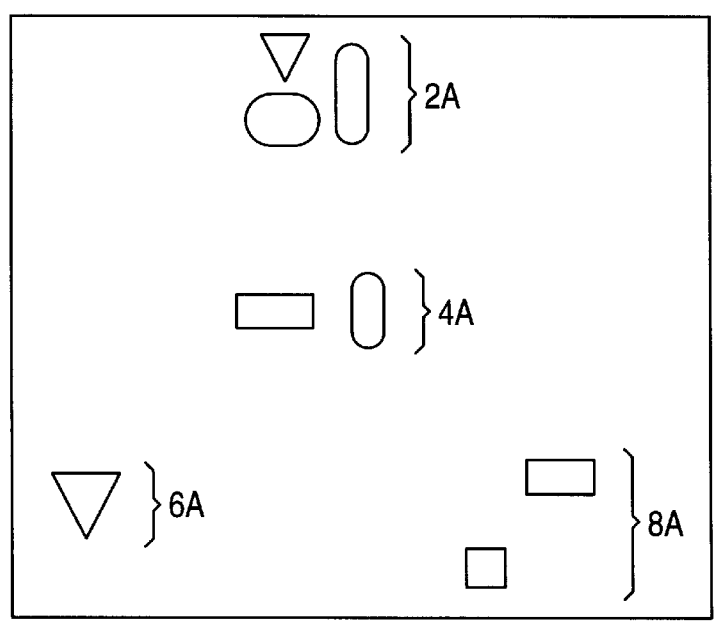
FIG. 5 is an illustration of nodes of an entity that the user has placed on a display screen.
Figure 6A:
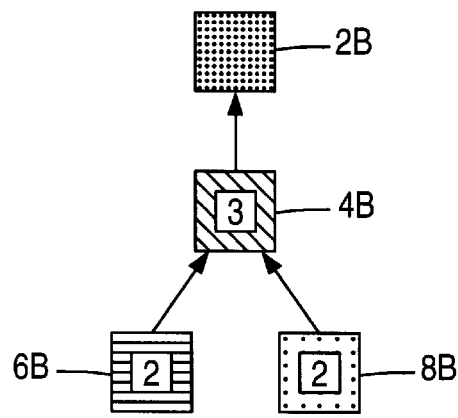
FIGS. 6A–6B are illustrations of a multiplicity tree and a concise network respectively, illustrating an exemplary entity and/or network defining multiplicity relationships between regions.
Figure 6B:
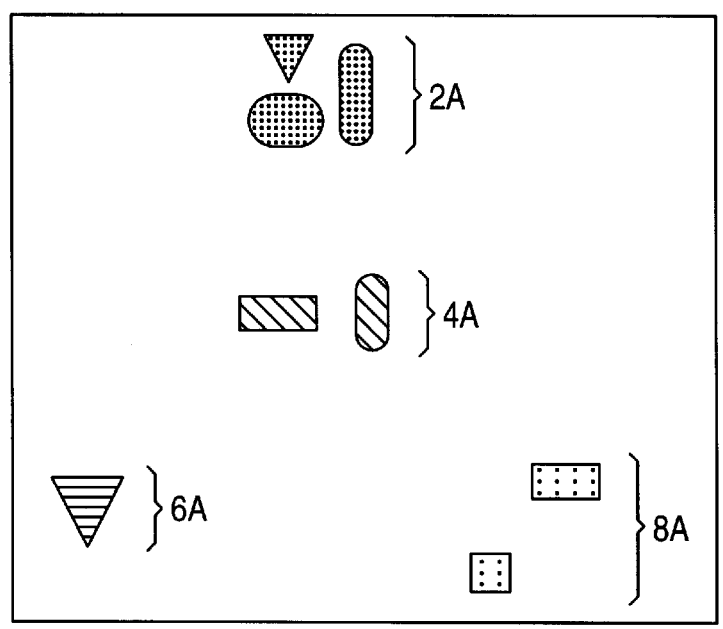

FIG. 5 shows the nodes of a network that the user has placed on the computer screen. The different shapes represent network nodes such as routers, work stations, servers, LANs, and the like, but not generally links or virtual circuits. Next, the user groups the nodes into regions, and defines multiplicity relationships between the regions as illustrated in FIGS. 6B and 6A, respectively. I have shaded elements in a common region with a common pattern.

The tree in FIG. 6A expresses the multiplicity relationships that the user has defined for the regions illustrated in FIG. 6B. Thus there are three diagonally-shaded regions 4A, 4B per top region 2A, 2B (the top region is the root region), and for example, there are two regions with the triangle node 6A, 6B per diagonally-shaded region 4A, 4B. In addition, there are two non-shaded regions 8A, 8B per diagonally shaded regions 4A, 4B.

Figure 7A:
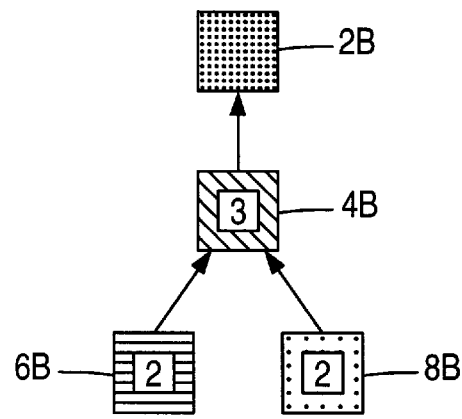
FIGS. 7A–7C are illustrations of a multiplicity tree, a concise network, and a detailed network respectively, illustrating an exemplary entity and/or network defining multiplicity relationships between regions with dashed lines for added clarity.

In some circumstances, I have placed dotted boxes and lines into the concise network illustrations, in order to see more clearly the relationships between the regions. These additional lines and boxes would not generally appear on the computer screen, although if the user desired such lines and boxes they may also be provided. Then the concise network appears as illustrated in FIG. 7B in accordance with the multiplicity tree illustrated in FIG. 7A.

Figure 7B:
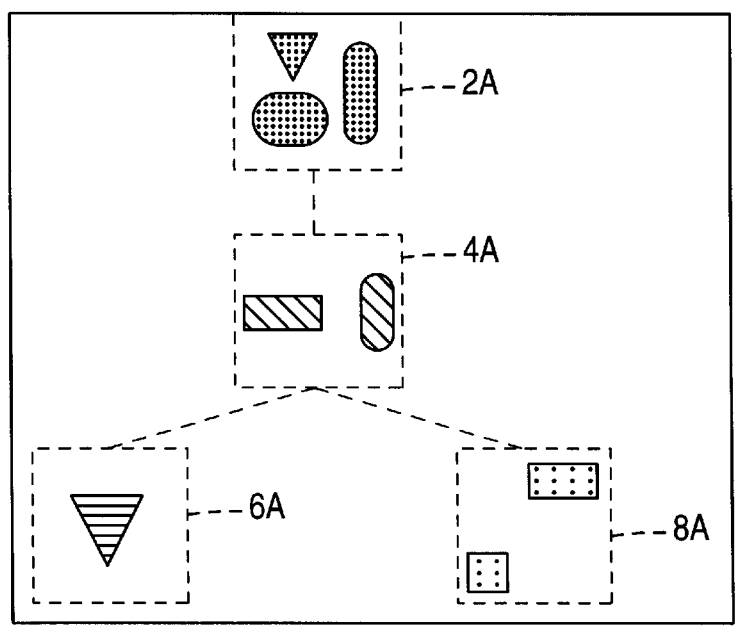
Figure 7C:
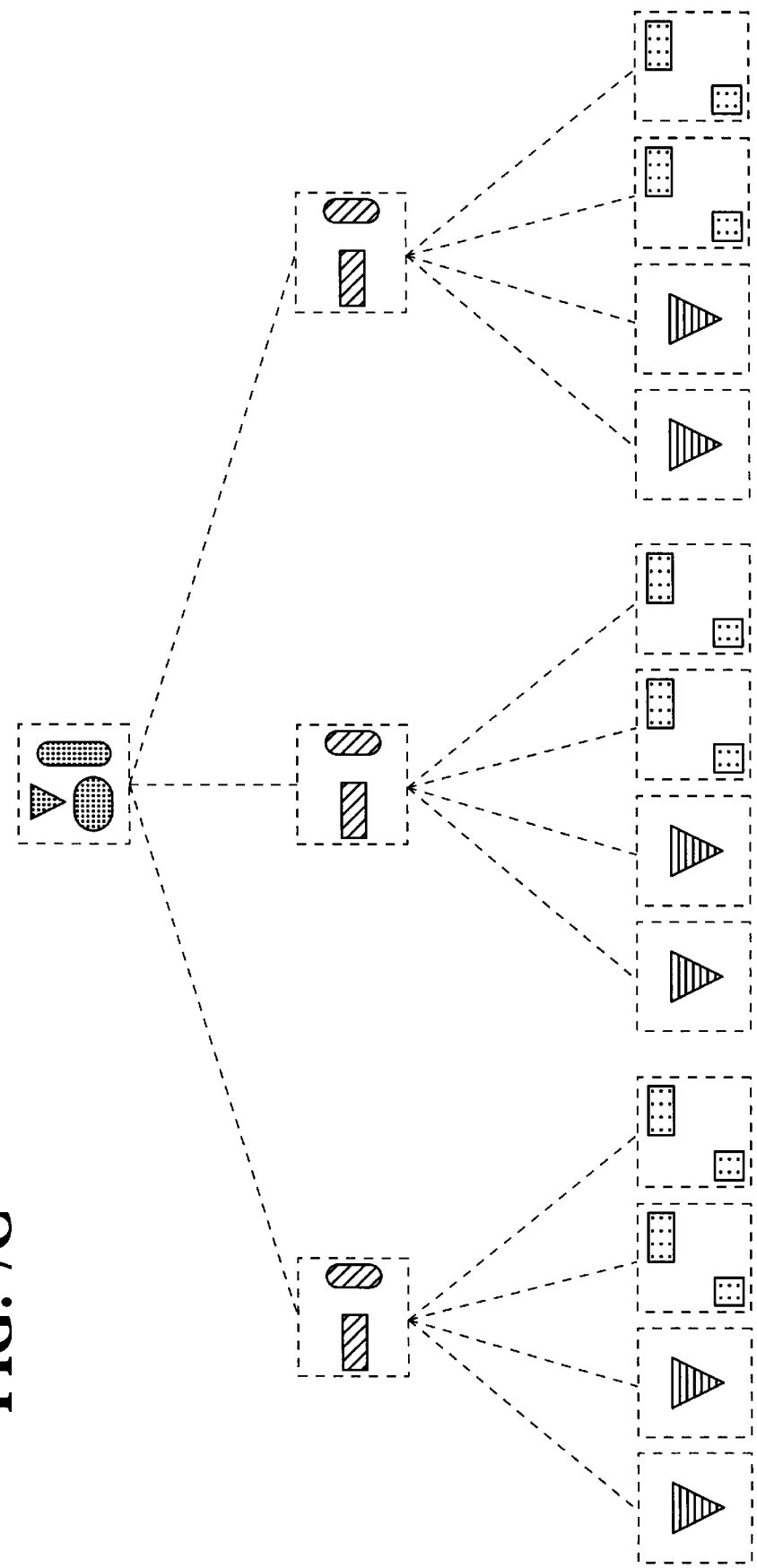

FIG. 7C shows the detailed network that the concise network of FIG. 7B describes. Each shaded element in the concise network is called the representative of the corresponding elements in the detailed network. Again, the boxes and dotted lines are not necessarily part of the detailed network. In what follows, I will sometimes include these dotted additions when they are helpful, and leave them out when the diagram would otherwise be too messy. I will also refer to this bottom diagram as the detailed network tree, to emphasize the tree relationships suggested by the dotted boxes and lines.

Figure 8:
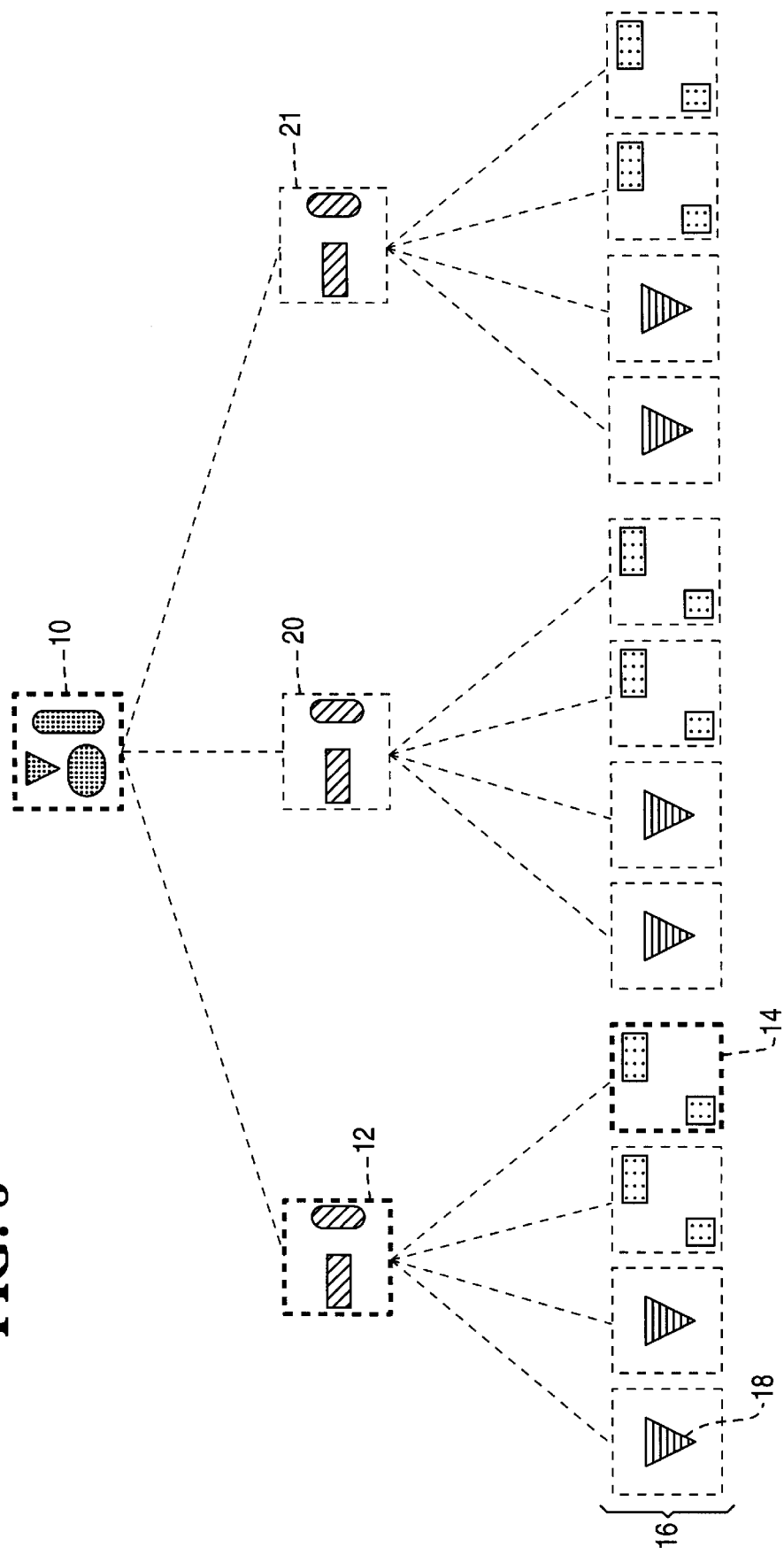
FIG. 8 is an illustration of a detailed network illustrating a branch of the network with bold dashed lines.

In FIG. 8, I have highlighted one of the many branches of the detailed network tree. The three heavily-dotted regions 10, 12, 14 lie on a common branch. Also, all of the 3+2+2=7 nodes lying in these regions lie on a common branch of the detailed network tree. Notice that by this terminology, no two triangles in the bottom row 16 lie on a common branch, nor do, for example, the bottom left corner triangle 18 and the middle diagonally-shaded rectangle in region 20 lie on a common branch.

Previously, one was allowed to draw in connections in the concise network, so long as the end nodes of the connection lay within a branch of the concise network tree. Each of these connections then defined a number of connections in the detailed network tree, each of which lay within a branch of the detailed tree. A connection lies in a branch of a tree if its end nodes do. The root of the network and/or entity tree is defined as the unique region that does not have a parent. Thus, in FIG. 8, the root is region 10. Those regions which have a common parent region are called the children of that common parent region. Thus in FIG. 8, the regions 12, 20 and 21 are the children of the root region 10. Each of these regions, in turn, has four children. A leaf of the network is a region having no children. Thus, in FIG. 8, one of the leaves is region 18. A branch consists of a leaf and all of its ancestor regions. Thus, in FIG. 8, the regions 1B, 12 and 10 constitute a branch, as 1B is a leaf, and its ancestors are regions 12 and 10.

Figure 9A:
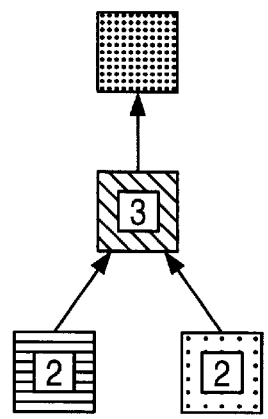
FIGS. 9A–9C are illustrations of a multiplicity tree, a concise network, and a detailed network respectively, illustrating an exemplary entity and/or network defining multiplicity relationships between elements/regions with connections (physical and/or logical) between regions having a direct tree relationship and/or connection.
Figure 9B:
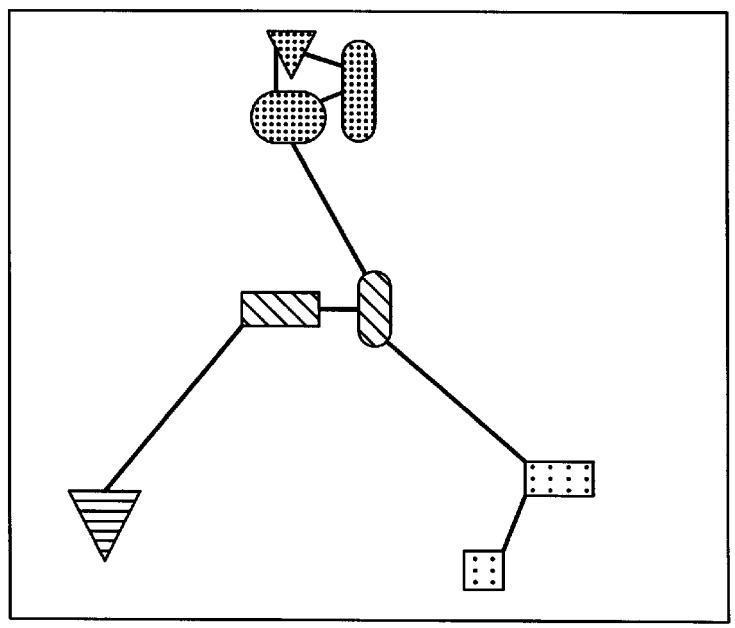
Figure 9C:
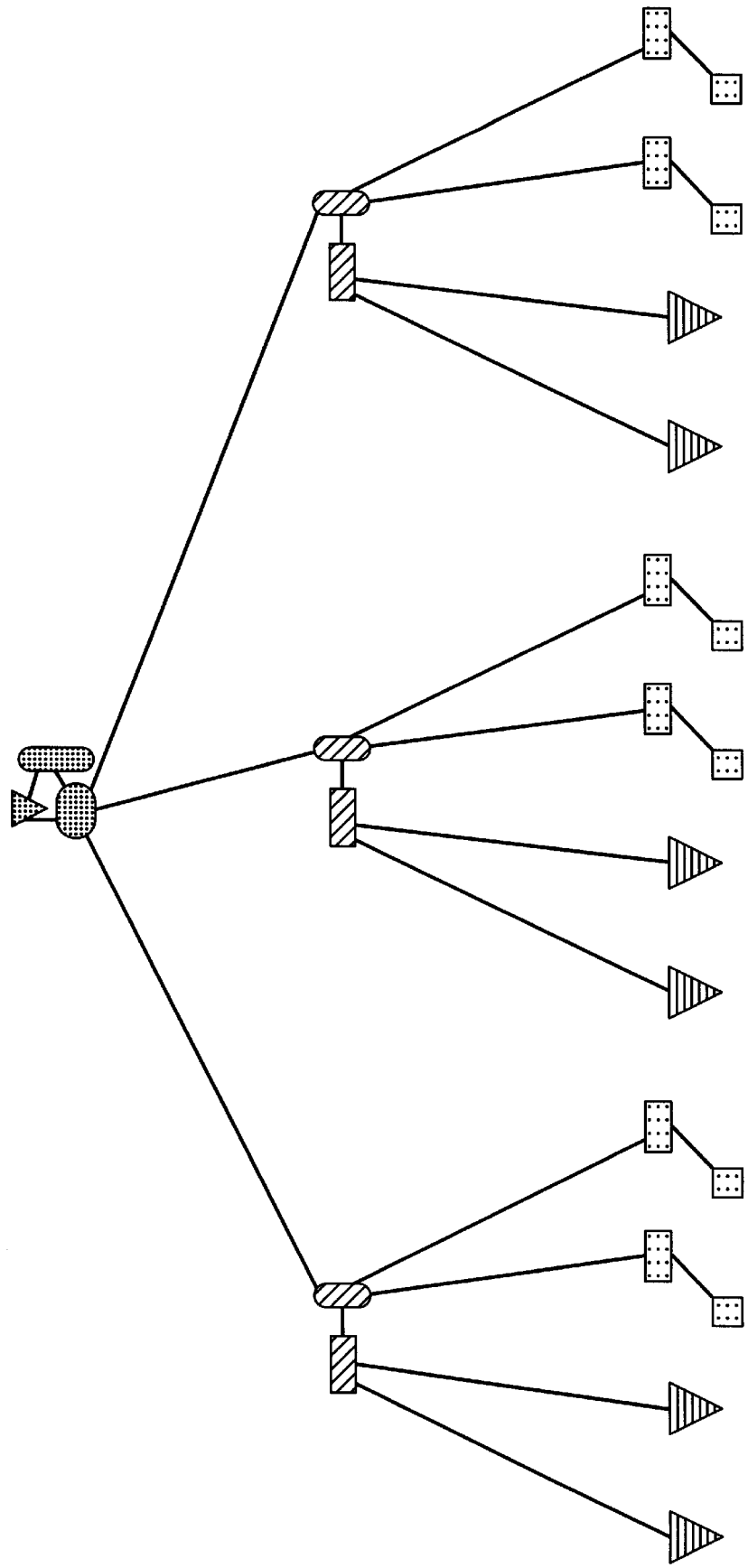

One example of a network describable as discussed is illustrated in FIGS. 9A–9C. I have omitted the dotted boxes and lines for simplification. However, it is obvious that the each of the connections lies in a common branch and/or region of the concise or detailed tree. Note that relationships are confined to connections (physical or logical) only with respect to elements lower on the tree than themselves or in the same region.

Figure 10A:
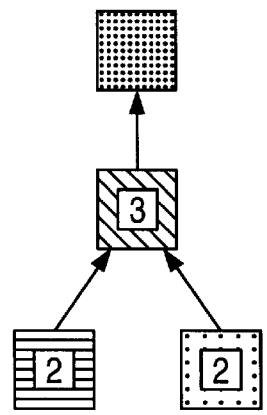
FIGS. 10A–10C are illustrations of a multiplicity tree, a concise network, and a detailed network respectively, illustrating an exemplary entity and/or network defining multiplicity relationships between elements/regions and some arbitrary familial relationships between regions.
Figure 10B:
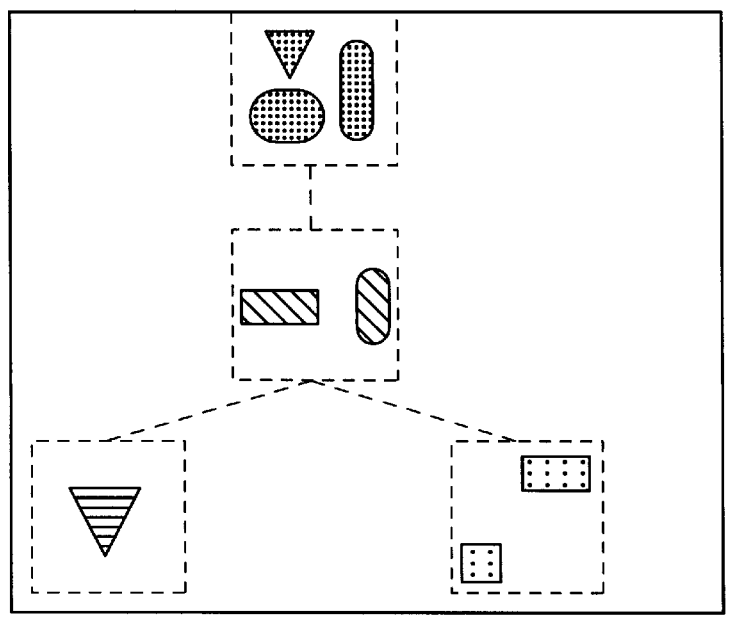
Figure 10C:
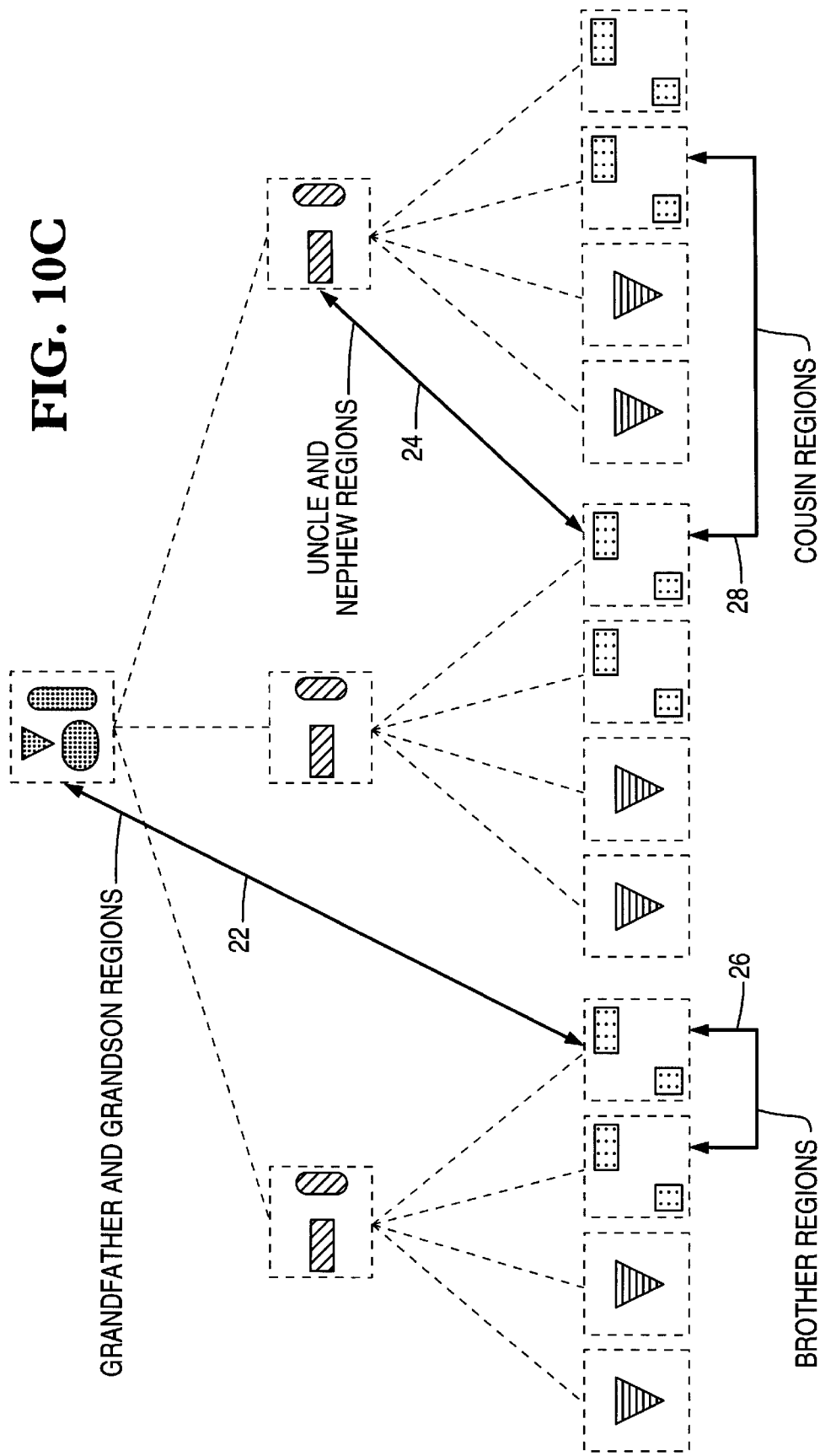

On the other hand, family relationships are between regions, not between nodes of regions. Thus, I will refer to, for example, brother regions, but not brother nodes (shapes). Note that in the previous description of relationships, it appeared that the relationships were between nodes: that is because earlier, each region consisted of but a single element. Thus, as illustrated in FIGS. 10A–10C, grandparent-grandchild relationships 22, uncle/aunt-nephew/niece relationships 24, brother relationships 26, and/or cousin relationships 28 are all possible.

In addition to the family relationships so far defined, we include one more: two regions R and S are said to have the identity relationship if R=S, i.e., if R and S are identical regions. (It will become clear in a moment why this new, rather trivial, relationship is needed.)

To define a more general set of connections, which include cross-branch connections, a new notation is necessary. Beside any connection in the concise network, we will write an integer 0, 1, 2, 3 . . . The number is called the family index. The default value is 0, so the absence of an integer implies that the intended integer is 0.

When a 0 is written beside a connection, the connection is intended to go between pairs of nodes lying in regions having the closest possible familial relationship. When a 1 is written, the connection goes between nodes in regions having the second closest familial relationship possible for the designated park. We now present some sets of diagrams. In each set, a single connection is drawn in the concise network. I then examine what connections are created in the detailed network for various values of the family index.

Figure 11A:
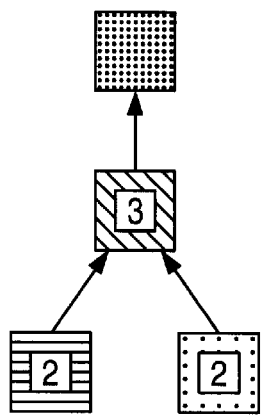
FIGS. 11A–11C are illustrations of a multiplicity tree, a concise network, and a detailed network respectively, illustrating an exemplary entity and/or network defining connections with an identity relationship between the end regions of the connections, (where an "end region" is a region containing an end node of the connection)
Figure 11B:
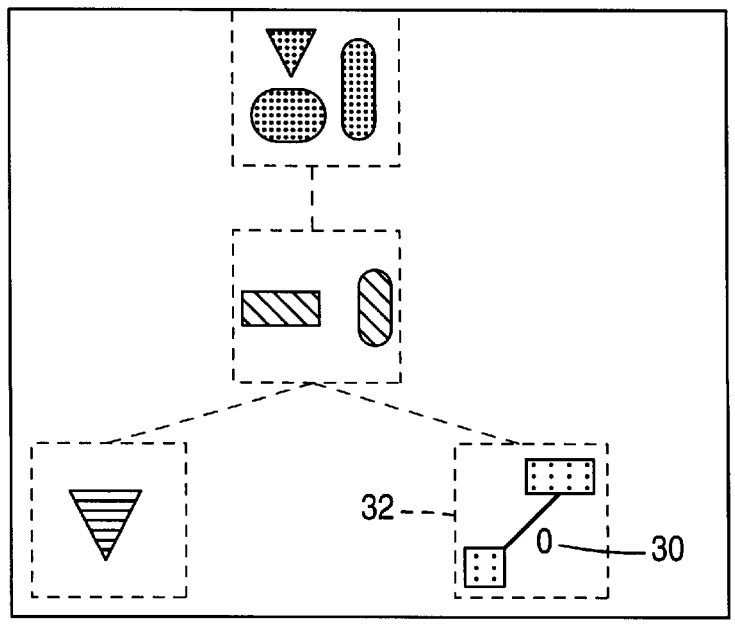
Figure 11C:
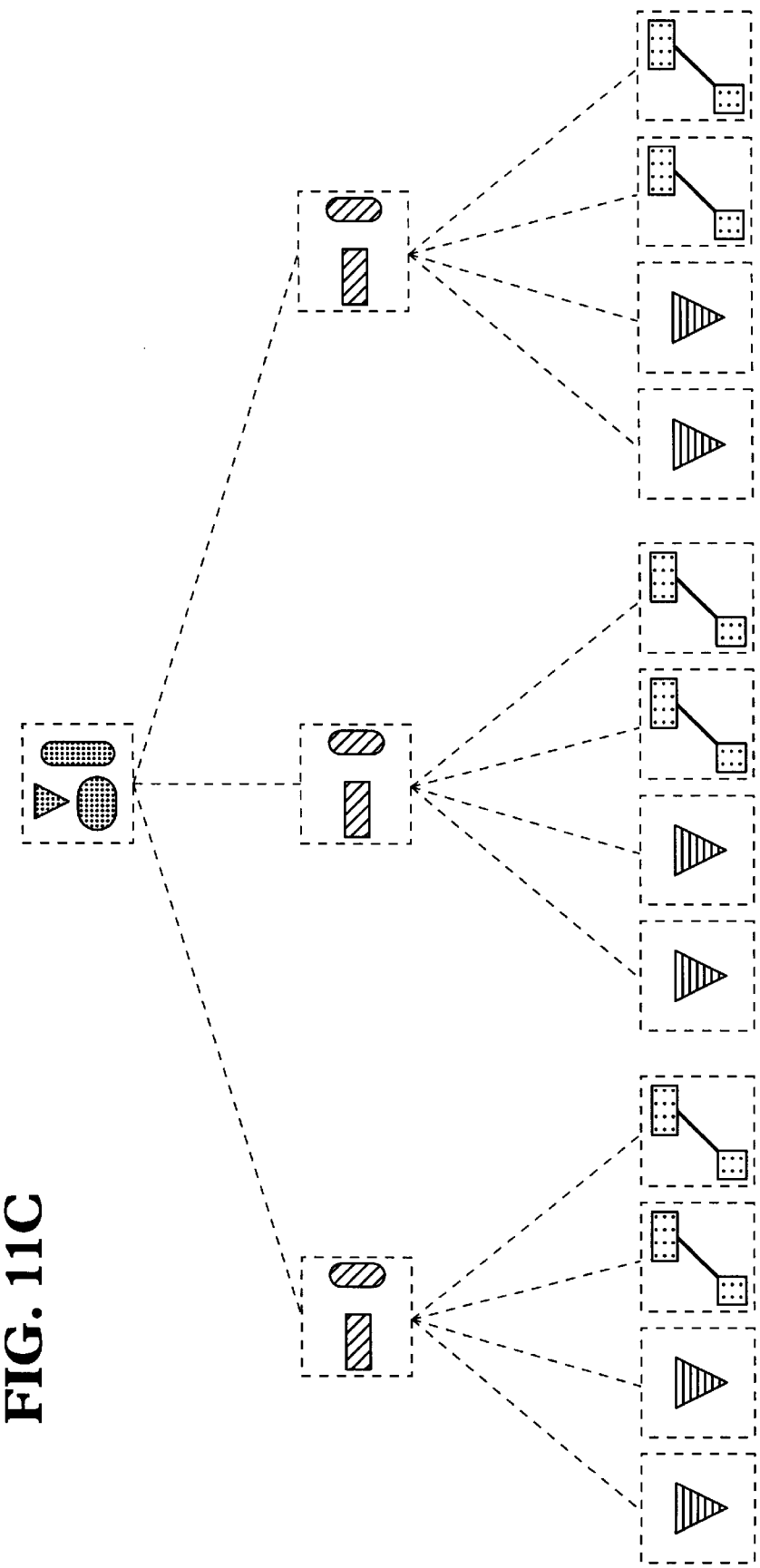

The first set, which involves a connection lying within a single region in the concise network diagram, is illustrated in FIGS. 11A–11C. Since the family index 30 is 0 at region 32, and since both nodes may lie in a common region 32 of the detailed network, the closest family relationship possible for this pair of nodes in region 32 is the identity relationship. Note that the 0 could also have been left off on the connection in the multiplicity tree, since 0 is the default.

Figure 12A:
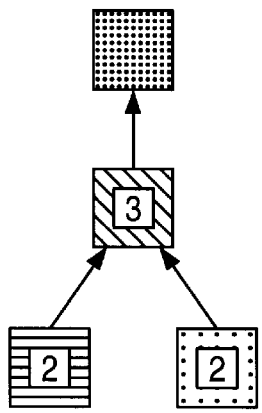
FIGS. 12A–12C are illustrations of a multiplicity tree, a concise network, and a detailed network respectively, illustrating an exemplary entity and/or network defining connections with a sibling relationship between the end regions of the connections.
Figure 12B:
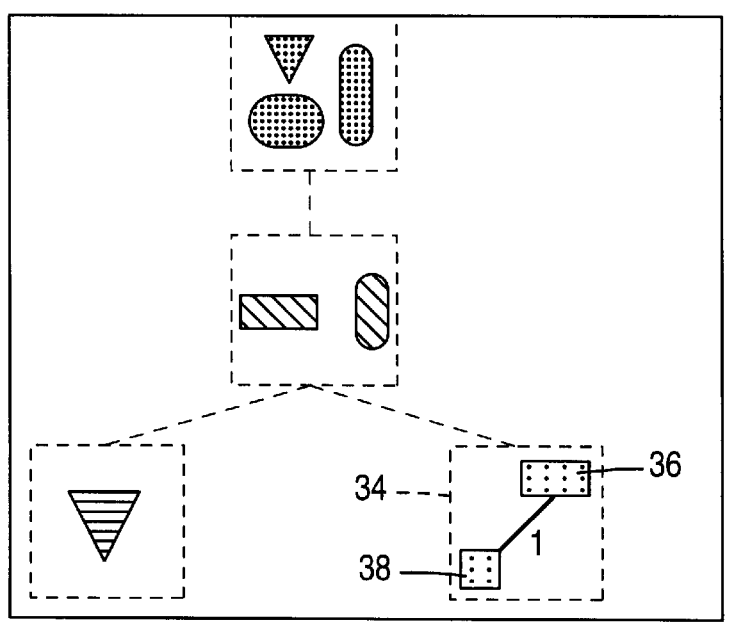
Figure 12C:
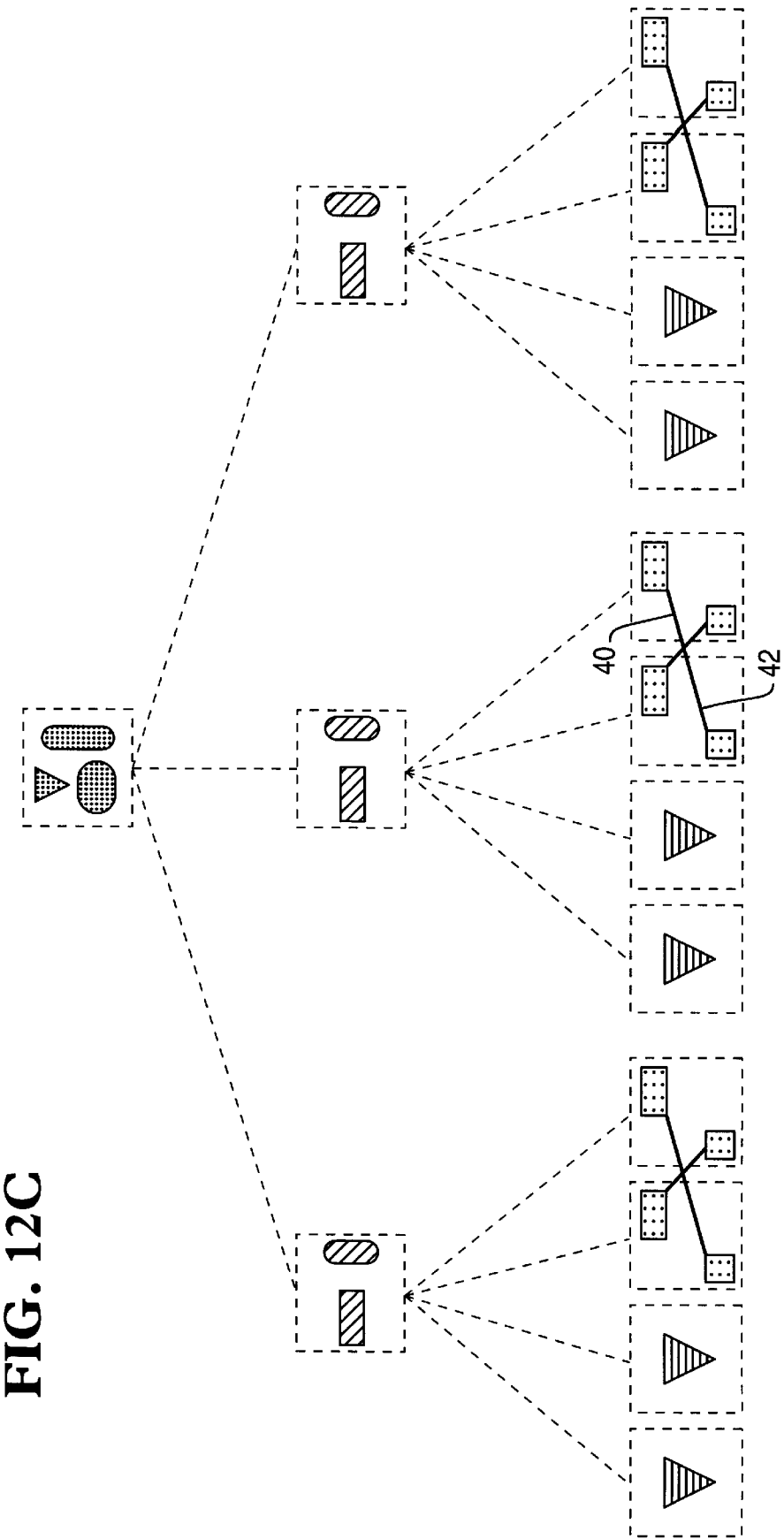

FIGS. 12A–12C are illustrations of the family relationship when the family index is set to 1. The closest pairs of regions now are brother regions via, for example, relationships 40, 42. Note that the family relationship specified in region 34 is the brother relationship between the rectangle 36 at the upper right hand corner of region 34 and the square 38 in the lower left hand corner of region 34. All possible pairs of connections are defined by the family index.

Figure 13A:
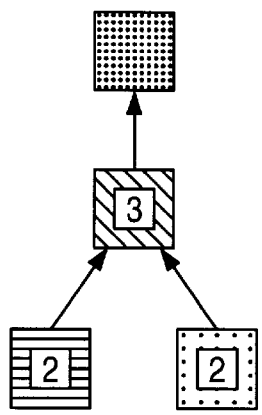
FIGS. 13A–13C are illustrations of a multiplicity tree, a concise network, and a detailed network respectively, illustrating an exemplary entity and/or network defining connections with a cousin relationship between the end regions of the connections.
Figure 13B:
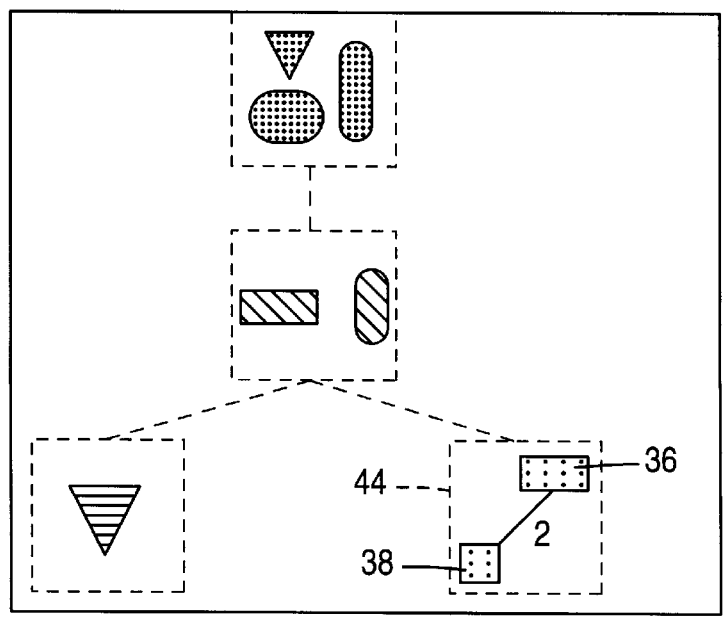
Figure 13C:
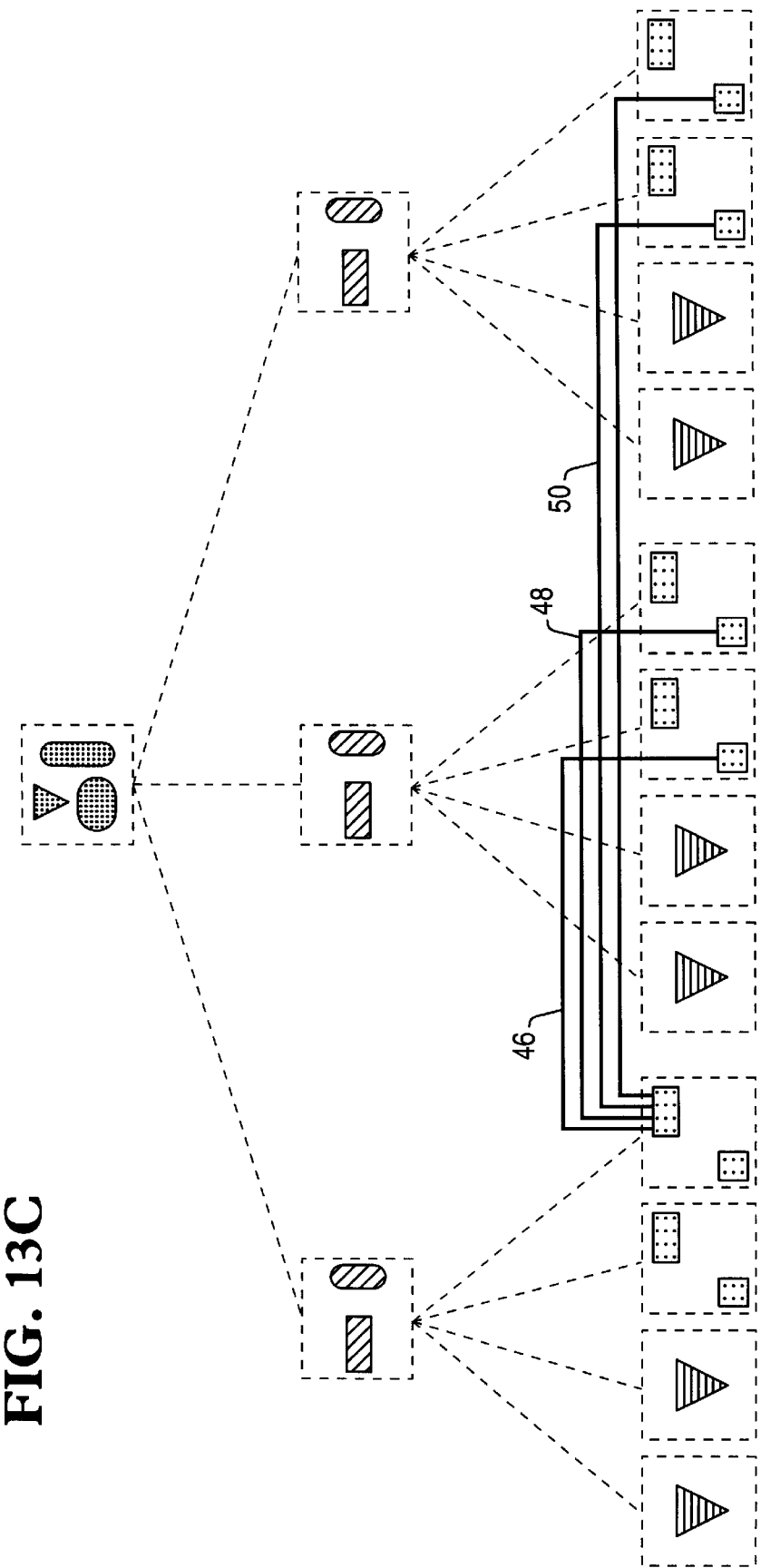

FIGS. 13A–13C are illustrations of the family relationship when the family index is set to 2. The closest pairs of regions now are cousin regions via, for example, relationships 46, 48, 50. Note that the family relationship specified in region 44 is the cousin relationship between the rectangle 36 at the upper right hand corner of region 44 and the square 38 in the lower left hand corner of region 44. FIG. 13C illustrates just four of the 12 intended connections.

If a family index of 3 or higher was used, it would result in an error. That is, a family index for a region or between regions cannot be higher than the number of links that are above the region until the root. More specifically, if a connection is being made between a region at the Mth level of the network tree and another region at the Kth level, and K is defined to be less than M, then the maximum family index equals K.

Figure 14A:
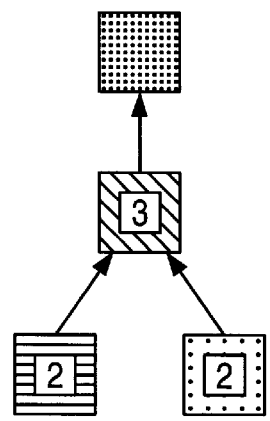
FIGS. 14A–14C are illustrations of a multiplicity tree, a concise network, and a detailed network respectively, illustrating an exemplary entity and/or network defining connections with a parent-child relationship between the end regions of the connections.
Figure 14B:
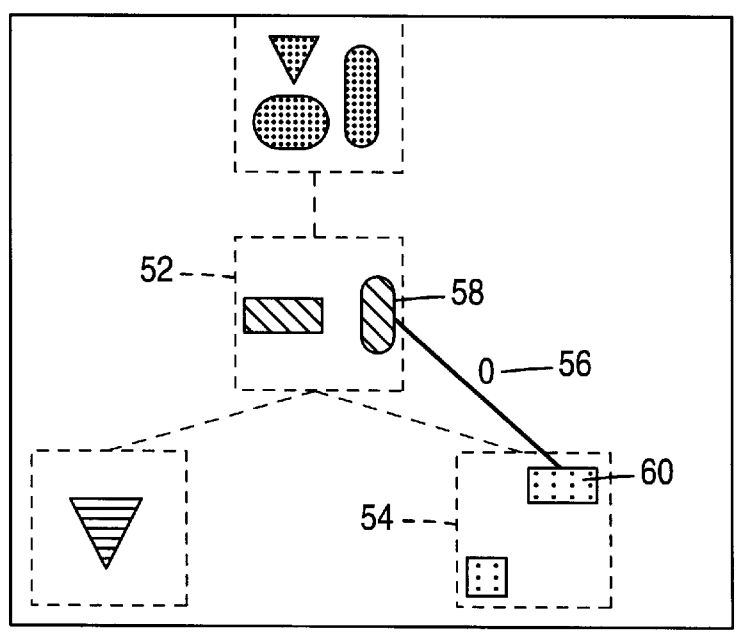
Figure 14C:
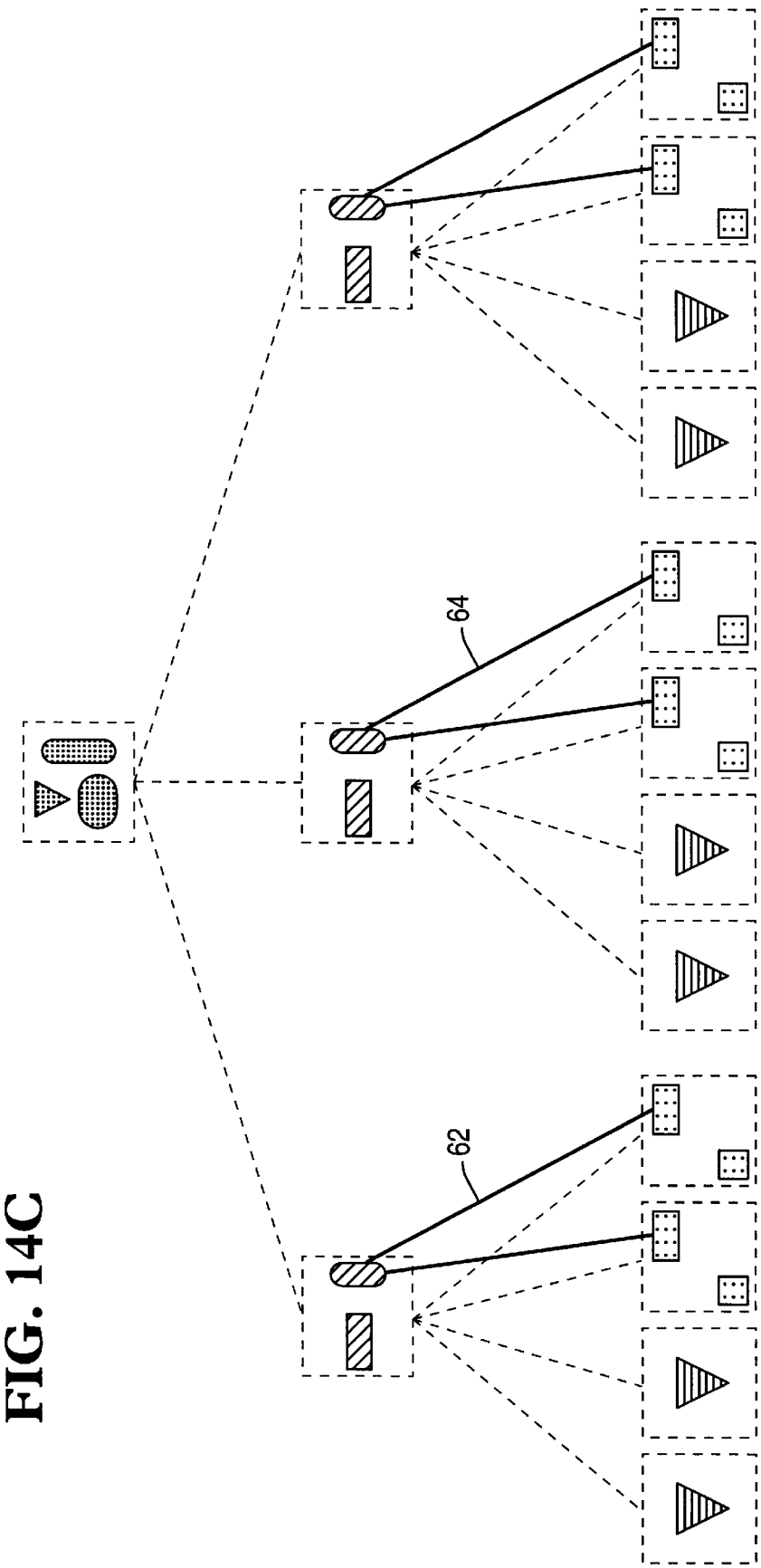

FIGS. 14A–15C examine a connection between elements lying in different regions of the concise network diagram. In FIGS. 14A–14C, the family index 56 is the 0 index for the connection between oval 58 in region 52 and rectangle 60 in region 54. Thus, the most closely related pairs of regions containing the ends of the connections are those having the parent-child relationship, for example, as illustrated by relationships 62, 64.

Figure 15A:
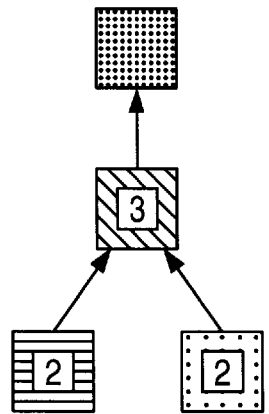
FIGS. 15A–15C are illustrations of a multiplicity tree, a concise network, and a detailed network respectively, illustrating an exemplary entity and/or network defining connections with an uncle/aunt-nephew/niece relationship between the end regions of the connections.
Figure 15B:
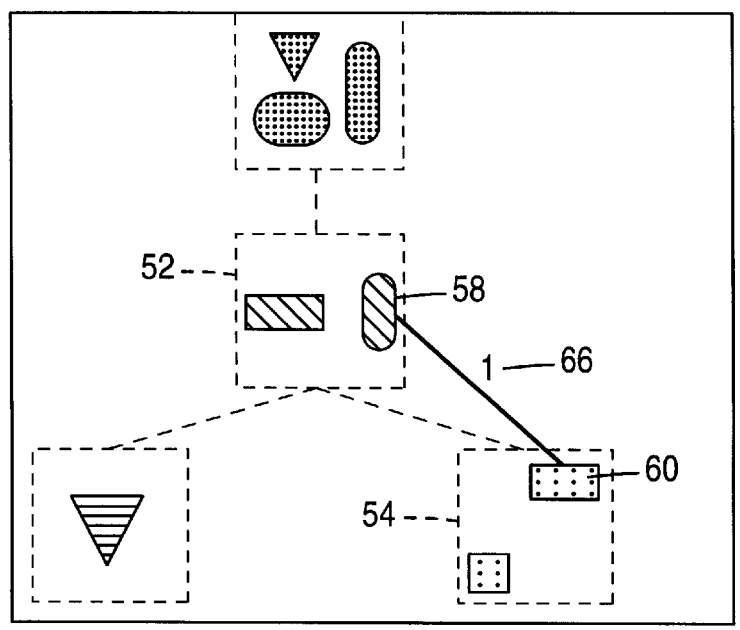
Figure 15C:
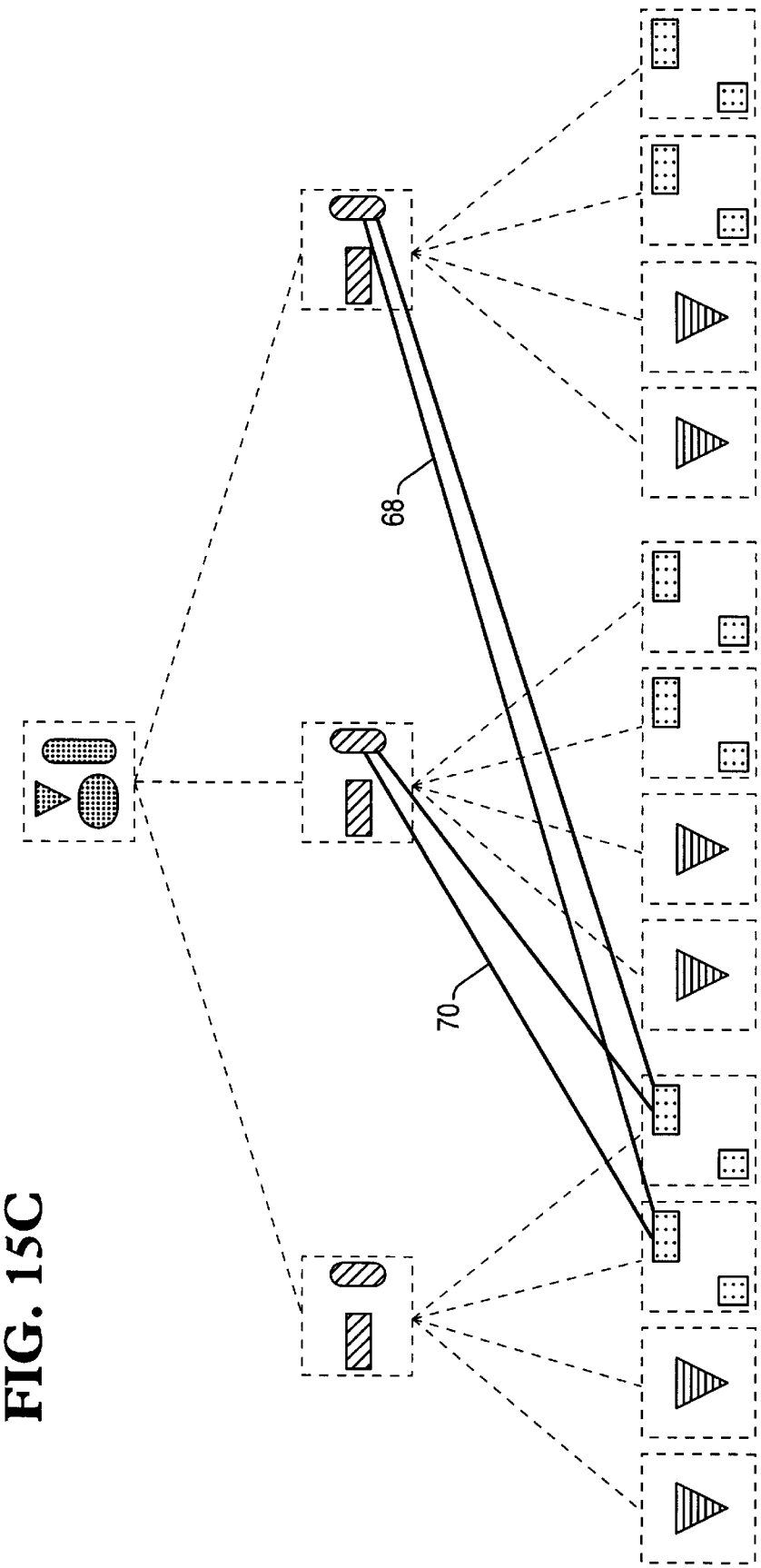

In FIGS. 15A–15C, the family index 66 is the 1 index for the connection between oval 58 in region 52 and rectangle 60 in region 54. Thus, the most closely related pairs of regions containing the ends of the connections are those having the uncle/aunt-nephew/niece relationship, for example, as illustrated by relationships 68, 70. If a higher family index was specified, an error would result. The pattern should be clear now. Notice that the connections drawn in FIG. 9B above could be interpreted as connections with the default family index of 0.

Now consider the lightly-shaded rectangles, for example, rectangle 60 in FIG. 15B, that have figured into every connection so far: How are connections between the rectangles specified? Here, the notation is extended. The issue is to represent a connection leaving a node in the concise network and returning to another one just like it. The connection needs to appear like a loopback link emanating from the common representative. A - - - ¦ shaped connection is used to denote such a "loopback" connection in the concise network. We also use it to denote a genuine loopback connection in the detailed network, in at least one case.

Figure 16A:
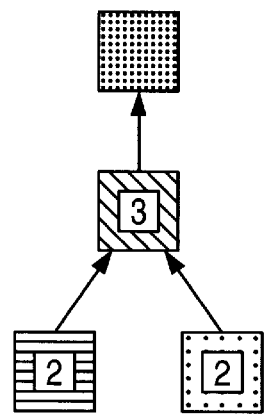
FIGS. 16A–16C are illustrations of a multiplicity tree, a concise network, and a detailed network respectively, illustrating an exemplary entity and/or network defining connections between nodes having a same representative, and having an identity relationship between the end regions of the connections.
Figure 16B:
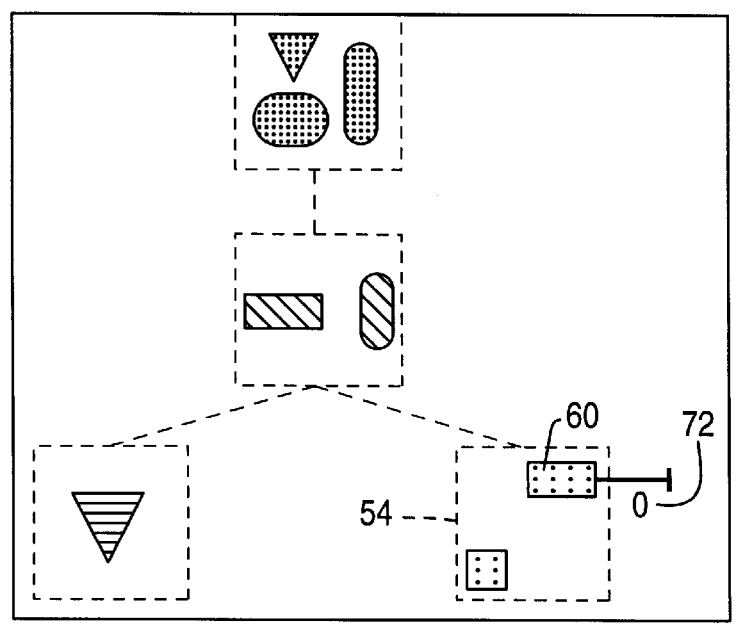
Figure 16C:
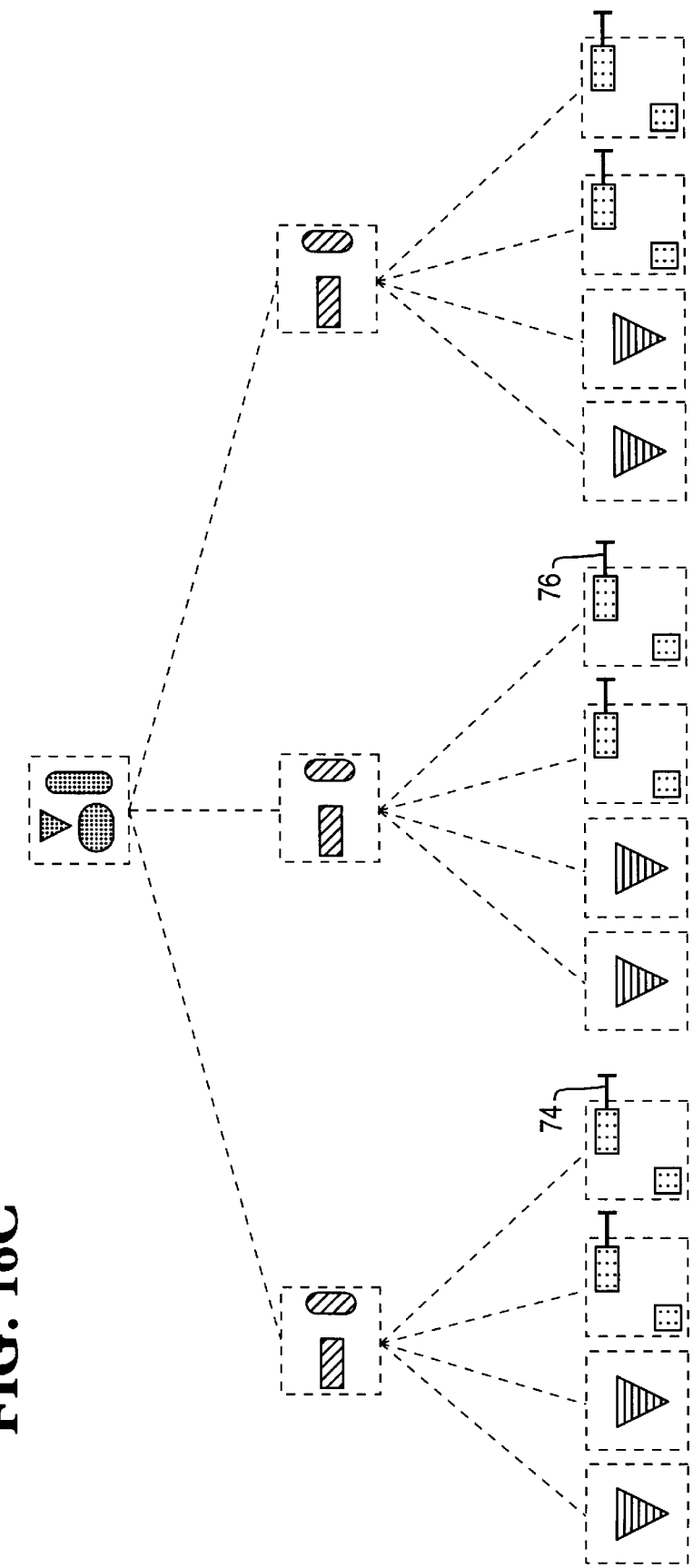

FIGS. 16A–18C examine a connection between elements having a common representative in the concise network. In FIGS. 16A–16C, the family index 72 is the 0 index for the loop-back connection for the rectangle 60 in region 54. Thus, the most closely related pairs of regions containing the ends of the connections are those having the identity relationship, for example, as illustrated by relationships 74, 76. Thus, the index of 0 indicates the closest (in a family sense) pair of regions each of which contains the rectangular element 60. Here the closest pair has the identity relation. The detailed network in FIG. 16C shows the entity sending to itself. Such loopback configurations are often used in testing.

Figure 17A:
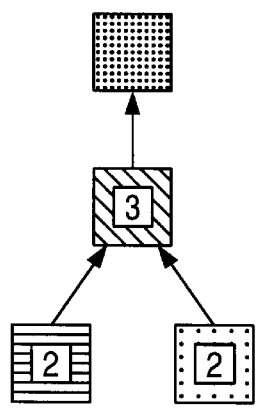
FIGS. 17A–17C are illustrations of a multiplicity tree, a concise network, and a detailed network respectively, illustrating an exemplary entity and/or network defining connections between nodes having a same representative, and having a sibling relationship between the end regions of the connections.
Figure 17B:
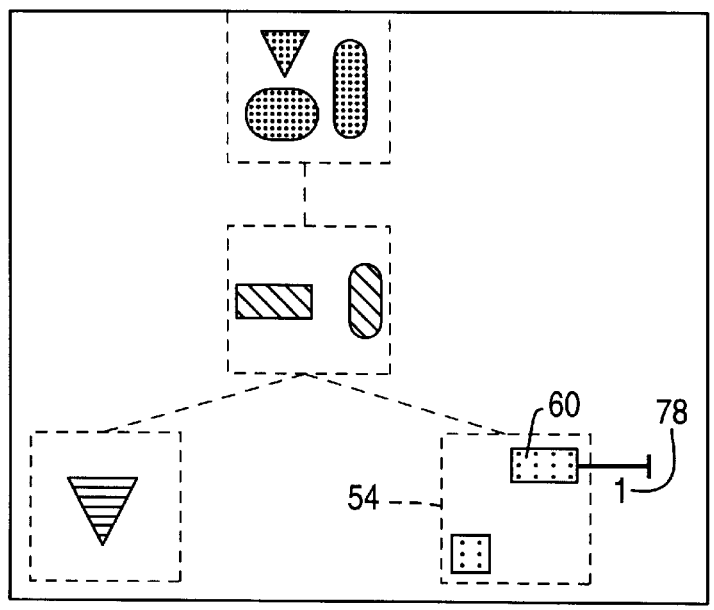
Figure 17C:
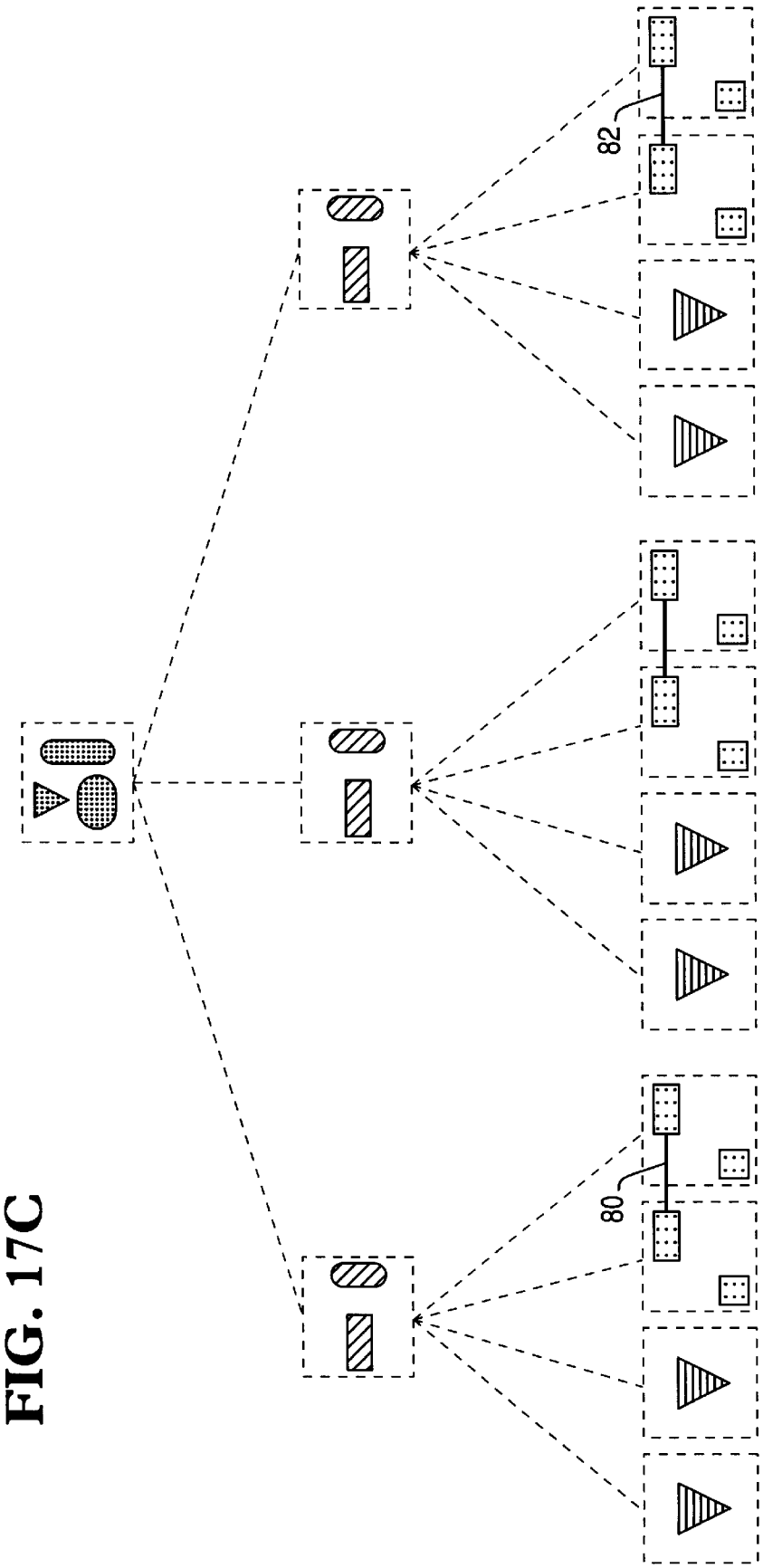

In FIGS. 17A–17C, the family index 78 is the 1 index for the sibling connection for the rectangle 60 in region 54. Thus, the most closely related pairs of regions containing the ends of the connections are those having the sibling relationship, for example, as illustrated by relationships 80, 82. Thus, the index of 1 indicates the second closest (in a family sense) pair of regions, besides the identity relationship, each of which contains the rectangular element 60. Here the closest pair has the sibling relation.

Figure 18A:
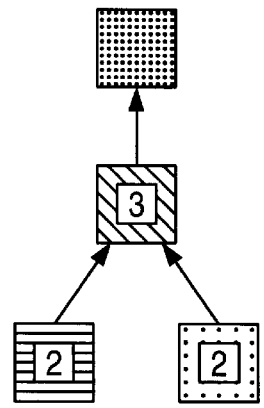
FIGS. 18A–18C are illustrations of a multiplicity tree, a concise network, and a detailed network respectively, illustrating an exemplary entity and/or network defining connections between nodes having a same representative, and having a cousin relationship between the end regions of the connections.
Figure 18B:
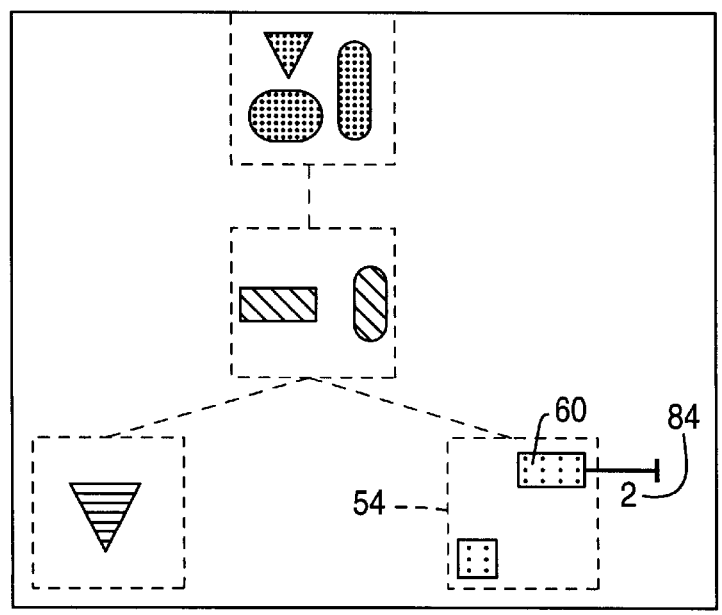
Figure 18C:
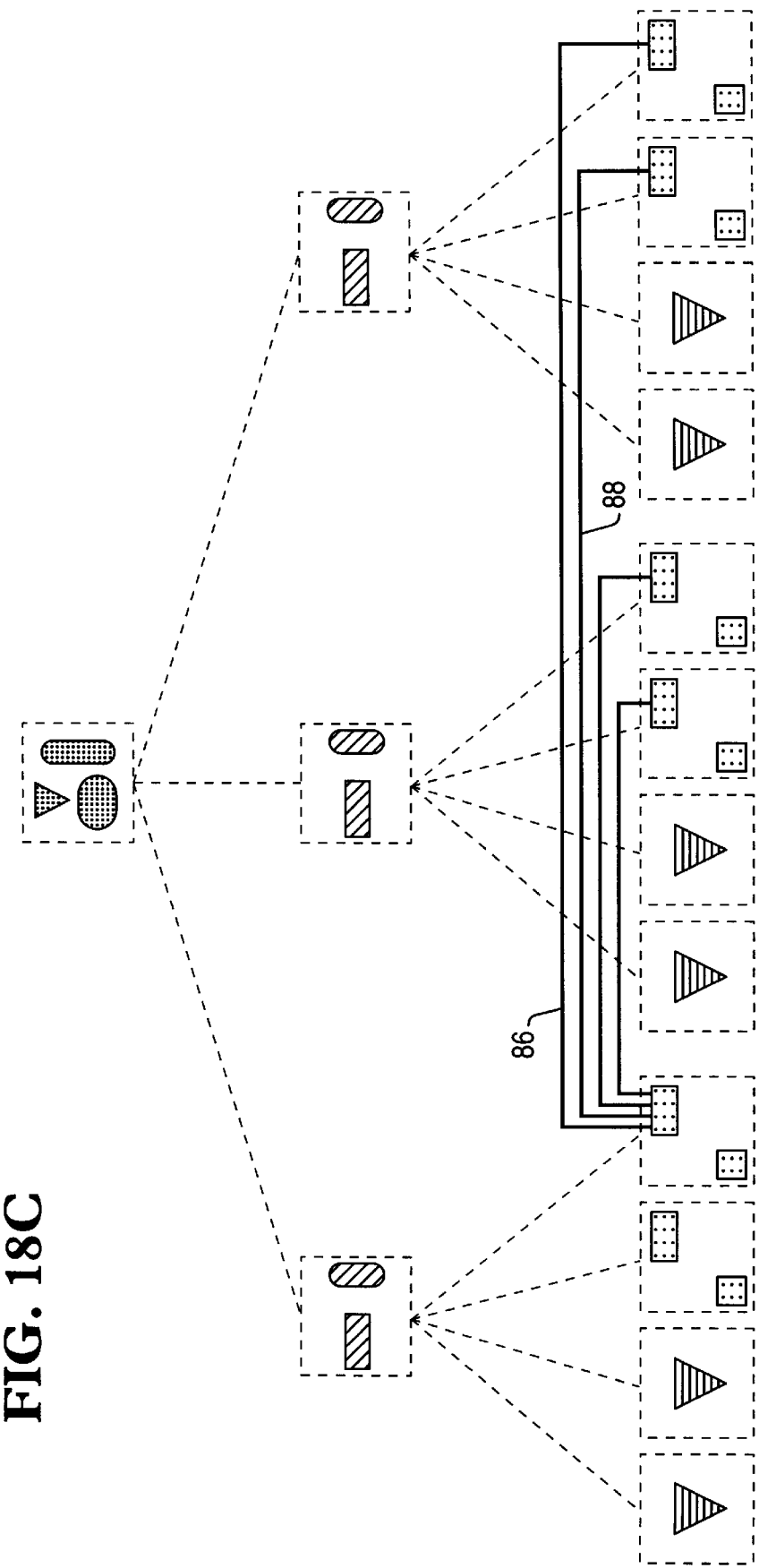

In FIGS. 18A–18C, the family index 84 is the 2 index for the sibling connection for the rectangle 60 in region 54. Thus, the most closely related pairs of regions containing the ends of the connections are those having the cousin relationship, for example, as illustrated by relationships 86, 88. Thus, the index of 2 indicates the third closest (in a family sense) pair of regions, besides the identity and sibling relationships, each of which contains the rectangular element 60. Here the closest pair has the cousin relation. FIG. 18C illustrates four of twelve intended connections. For this tree, a family index exceeding 2 would yield an error.

Throughout this description, connections could represent either physical links, virtual circuits, sessions, and/or any other relationship. For the loopback connections, a default (when no index is written) would be 0 for a testing environment, 1 for a commercial environment.

Comparison with other models available today

This multiplicity method is now compared with the offerings of other models. Some of the benefits mentioned earlier are now described.

Easy to describe, display and change network

It has been shown that one needs only describe one of each kind of entity. It is easy to change the multiplicities of resources. Changing the multiplicity of a resource (i.e., of its region) can be done without changing connection definitions.

For other models, one must draw the entire network, however many nodes it may have. This means one has to consider the space on the screen, and rearrange the objects on the screen to make them fit (zoom capabilities notwithstanding). Although cut and paste techniques reduce the amount of labor, it can still be considerable.

If one wishes to change the number of some cloned set of objects, then the change typically requires an error-prone deletion or addition of cloned objects (you must keep count of the number you have of each). Also, one invariably has to redefine connections after a change in the number of a set of objects.

Efficiency

Suppose that there were 100 instances of presumably similar nodes or sessions. One hardly wishes to examine each of their 100 performance values. Moreover, it is a time-consuming and error-prone task to attempt to average the 100 values. Recognizing this problem, other models simply advise the user to collect statistics on just one sample member of each group, and take that value as typical of the group.

There are two flaws in this approach. One is that one must be certain that the sample member truly represents the group, i.e., that all members of the group are statistically identical in their performance. All members of the group must see statistically identical traffic, and all must be identically parameterized. This is not easy to check and/or verify without the structure that I have imposed on the network.

The other flaw is in the waste of information that occurs when one looks at the performance of only a single member of a group. Suppose that there are 100 sessions in a group, but that one looks at the response time of just one of these sessions. If the session had 200 transactions pass through it (we assume now that we have a simulation model), then the average seen is based upon just those 200 transactions, even though the group saw about 100 * 200=20,000 transactions. In my approach, the group average would be for 20,000 transactions, and would be a vastly more reliable statistic. Other models simply throw away information when they use a single session to represent the group. My method is efficient in that it utilizes every piece of relevant information, and is able to simulate performance in a more efficient manner.

These same considerations apply to utilizations of links and nodes. Although we have only mentioned utilizations and response times, the above averaging considerations also apply to queue sizes, which also are a part of a model report.

Concise performance report/efficient use of data

We have seen above how one gets an average value for each object in the connectivity diagram. Other models cannot give averages, because they have no concept of a group of like objects. Although they allow one to clone a set of objects, they do not regard the cloned set as truly a replica of the original set. There are two reasons for this:

First, other models allow cloned objects to be reparameterized. This would be analogous to our allowing parameters to be randomly assigned in the full network diagram, which could destroy all of the symmetries. The performance of nodes or sessions having different parameters cannot be averaged together. Note: Cloning is just a way of getting a set of objects on the drawing board in an easy manner. But, other models regard clones as new, individual objects in no way related to the original set which was cloned.

Second, when a set of objects is cloned, there is no guarantee that they will not carry traffic from very different traffic streams.

For these two reasons, it is impossible for other general purpose models to give an average of a group of objects; an average value could be misleading by obscuring potentially large differences in performance between dissimilarly-behaving members of the group. Other models simply have no structure to provide a group of identically-behaving objects, whose performance results may be averaged together.

Housing 105 includes a hard disk drive 120 and a floppy disk drive 125. Hard disk drive 120 is suitable to provide fast access storage and retrieval. Floppy disk drive 125 is suitable to receive, read or write to external disks, and may be replaced by or combined with other conventional structures for transferring data or instructions, including tape and compact disk drives, telephony systems and devices (including telephone, video phone, facsimile or the like), network communication ports and the like. "Or," as the term is used herein, means and/or.

Housing 105 is partially cut-away to illustrate a battery 130, a clock 135, a detached local memory 140 and a processor 145, all of which are suitably housed therein. Detached local memory 140 is operative to store data and tasks. Processor 145, which is associated with detached local memory 140, is operative to execute selected ones of the tasks.

In an exemplary embodiment, display device 110, which is associated with processor 145, is operative to provide a display area 150 that is accessible to executed ones of the plurality of tasks. Display area 150 is capable of displaying a symbolic representation of a model in accordance with the principles of the present invention. hard disk drive 120 or detached local memory 140, either separately or collectively, store a network modeling task.

The modeling task is retrievable and executable by processor 145 to create a set of associated data records that represent a plurality of network elements within the network model. The associated data records include multiplicity indicia for providing an abbreviated expression of quantities of the network elements within the network model. "Multiplicity," as the term is used herein, includes to be various, manifold, multitude and the like. "Indicia," as the term is used herein, includes indicators, manifests, evidence, identifier or the like. The multiplicity indicia is used to simplify the display of the symbolic representation of the network model in display are 150 on display device 110. The associated data records preferably include a set of network element characteristics (e.g., capacity parameters, operating parameters, etc.), a set of network characteristics (e.g., capacity parameters, operating parameters, etc.), or the like.

Although processing system 100 is illustrated having a single processor, a single hard disk drive and a single local memory, processing system 100 may suitably be equipped with any multitude or combination of processors or storage devices. Processing system 100 may, in point of fact, be replaced by, or combined with, any suitable processing system operative in accordance with the principles of the present invention, including sophisticated calculators, and hand-held, laptop/notebook, mini, mainframe and super computers, as well as processing system network combinations of the same.

Exemplary keyboard 115 may suitably provide a user interface. Keyboard 115, which is associated with processor 145, is operative to generate control signals that are usable for controlling the aforementioned network modeling task. Although keyboard 115 is provided, any suitably arranged apparatus or device for receiving user input and generating control signals in response thereto may replace, or be used in conjunction with, keyboard 115.

Conventional processing system architecture is more fully discussed in *Computer Organization and Architecture*, by William Stallings, MacMillan Publishing Co. (3rd ed. 1993); conventional processing system network design is more fully discussed in *Data Network Design*, by Darren L. Spohn, McGraw-Hill, Inc. (1993), and conventional data communications is more fully discussed in *Data Communications Principles*, by R. D. Gitlin, J. F. Hayes and S. B. Weinstain, Plenum Press (1992) and in *The Irwin Handbook of Telecommunications*, by james Harry Green, Irwin Professional Publishing (2nd ed. 1992). Each of the foregoing publications is incorporated herein by reference.

Figure 19:
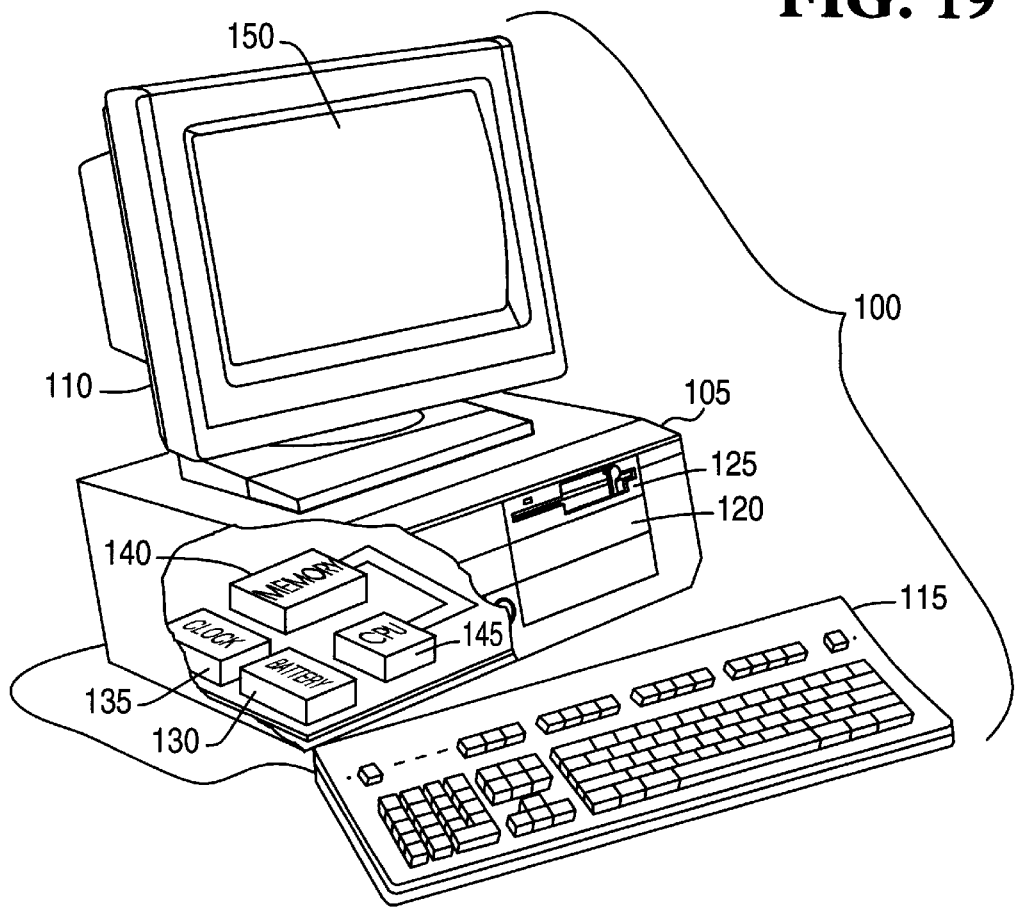
FIG. 19 is an illustration of an isometric view of an exemplary processing system.
Figure 20:
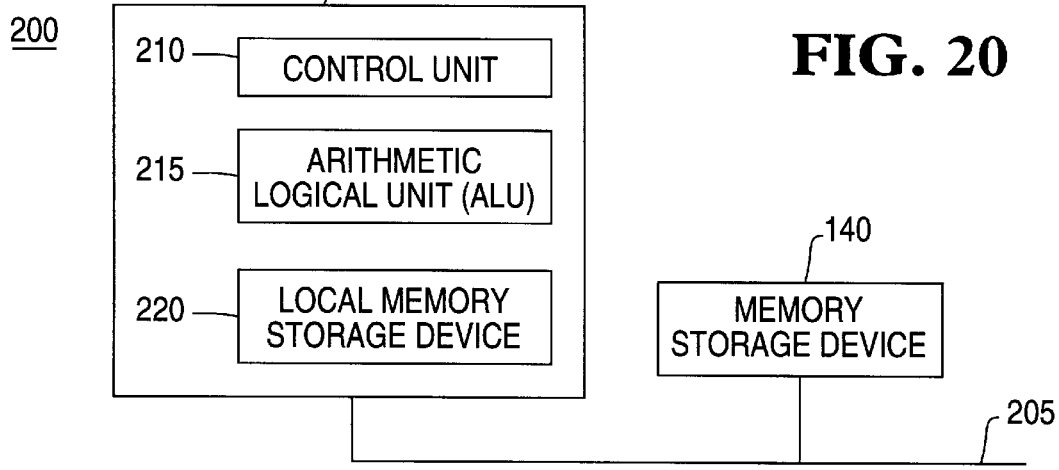
FIG. 20 is a block diagram of an exemplary microprocessing circuit that may suitably be implemented in the processing system of FIG. 19.

FIG. 20 illustrates a block diagram of an exemplary microprocessing circuit 200 that may suitably be implemented in processing system 100 of FIG. 19. Microprocessing circuit 200 includes detached local memory 140 coupled via data bus 205 to processor 145. Memory 140 is operative to store data or instructions, which processor 145 is operative to retrieve and execute. Processor 135 includes a control unit 210, an arithmetic and logic unit ("ACLU") 215, and an internal memory 220 (e.g., stackable cache, a plurality of registers, etc.). control unit 210 is suitably operative to fetch ones of the instructions from memory 140. ACLU 215 is suitably operative to perform a plurality of operations, such as addition and Boolean AND, needed to carry out those instructions. Internal memory 220 is suitably operative to provide local high speed storage used to store temporary results and control information.

In alternate preferred embodiments, the above-identified processor, and in particular microprocessing circuit 200, may be replaced by or combined with any other suitable processing circuits, including programmable logic devices, such as PALs (programmable array logic) and PLAs (programmable logic arrays). DSPs (digital signal processors), FPGAs (field programmable gate arrays), ASICs (application specific integrated circuits), VLSIs (very large scale integrated circuits) or the like.

Figure 21:
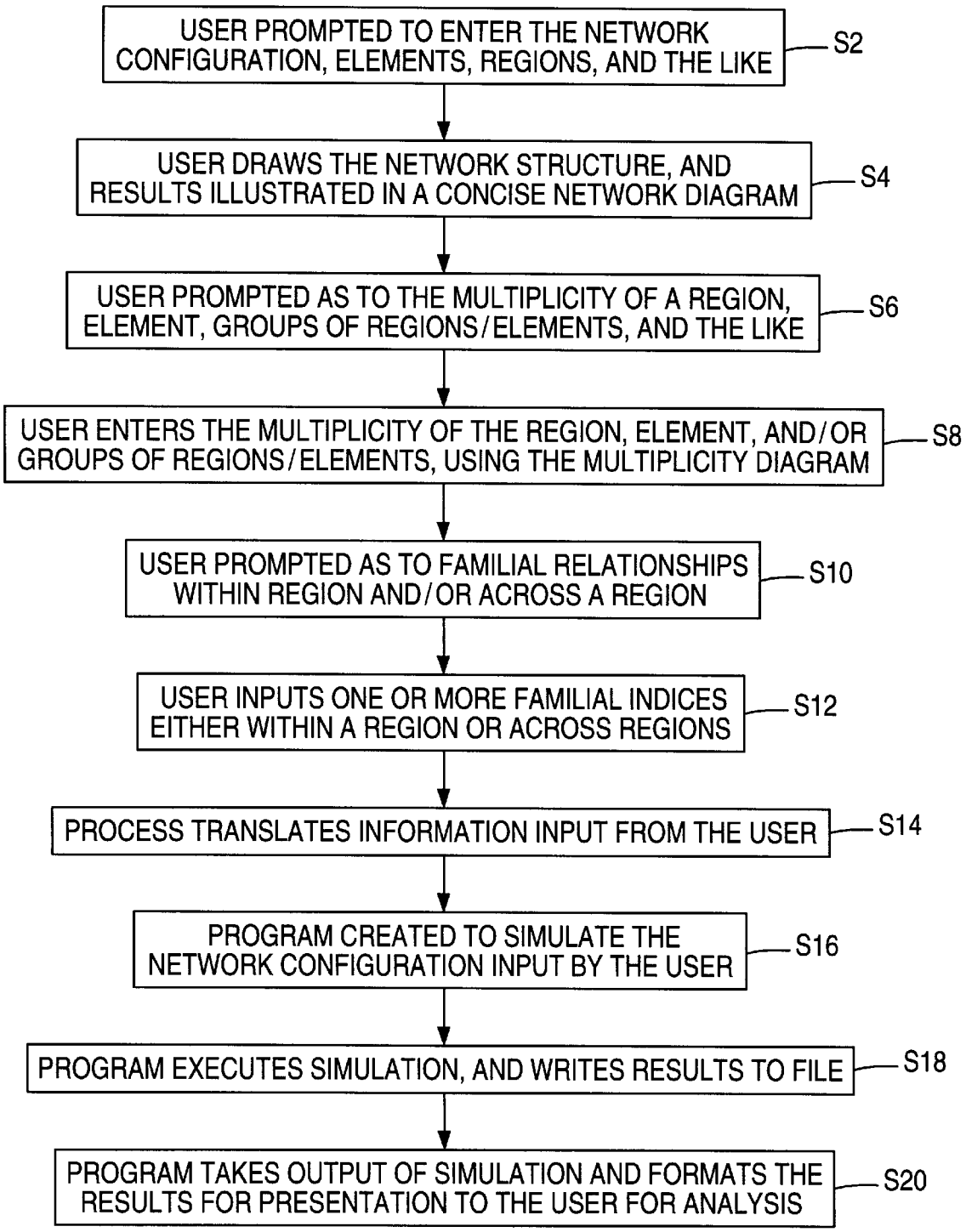
FIG. 21 is a flow chart of the detailed computer process of the present invention.

The main process of the present invention is illustrated in FIG. 21. In FIG. 21, the computer implemented and assisted process begins in Step S2 where the computer process prompts the user to enter the network configuration, elements, regions, and the like. The user draws the network in Step S4, via computer assistance, by, for example, dragging icons and/or shapes onto the active screen area, connecting icons and/or shapes, assigning one or more models to one or more of the icons and/or shapes, indicating processing speed, and the like. A tree structure and/or other hierarchical structure and/or configuration results and is illustrated in a concise network diagram described and illustrated above.

The computer implemented and/or assisted process prompts the user in Step S6, after or during set up of the structure, as to the multiplicity of a region, element, groups of regions/elements, and the like. The user then enters in Step S8, the multiplicity of the region, element, and/or groups of regions/elements using the multiplicity diagram described and illustrated above. The computer implemented and/or assisted process prompts the user in Step S10, as to the familial relationships within a region and/or across a region. Next, in Step S12, the user inputs one or more familial indices either within a region or across regions in the concise network graphical interface.

In Step S14, the process now processes, converts and/or translates the information input from the user, and creates, for example, in memory by writing to a file various structures that a C language program/compiler would require. The way the program wants to see and understand it as data it translates what the user puts in to the way the program wants to see the data.

In Step S16, and internal C program is created to simulate the network configuration input by the user to determine, for example, how much traffic is be transmitted from place to place, how busy various processors and links are, and predicted response times. In Step S18, the program then writes the results of interest to the user into, for example, a file containing and/or providing the results of the simulation.

The next step, Step S20, is that the program which takes the output of the simulation and formats the results for presentation to the user for analysis. For example, the simulation results may be displayed on a screen and/or printed on a printer.

Figure 22:
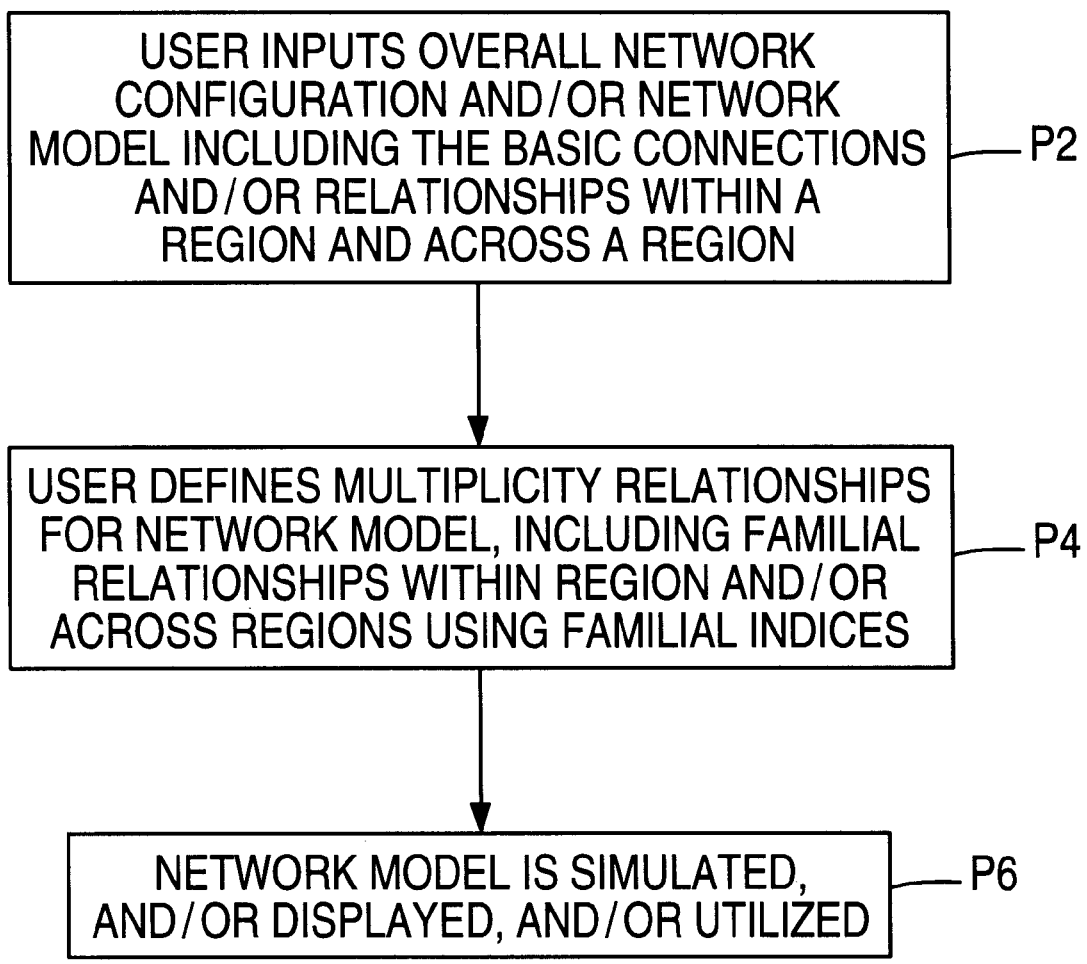
FIG. 22 is a flow chart of the generalized computer process of the present invention.

FIG. 22 is a flow chart of a more basic and/or general description of the computer implemented process of the present invention. There are generally three steps: in Step P2 the user inputs the overall network configuration and/or network model including the basic connections and/or relationships within a region and across a region. In Step P4, the user defines multiplicity relationship for the network model, including the familial relationships within a region and/or across regions using one or more familial indices. In Step P6, the network model that has been defined by the user is then simulated, and/or displayed, and/or utilized by the computer process and/or the user in accordance with a predetermined manner.

The principles of the present invention, which disclose systems and methods for generating and displaying a model such as a network, may, in point of fact, be any conventional entity having a network-like or hierarchical relationship, including wired and wireless systems.

The network exemplified herein includes, for example, one or more of a plurality of nodes, which can be workstations, a plurality of routers, a WAN, a FDDI, a backbone network and a host node. Collectively, the foregoing, as well as gateways, links, bridges, portal devices, switches, LANs and the like, may suitably be referred to as "network elements." The term network represents a connectivity diagram of interconnected elements having a predetermined relationship, and preferably a hierarchical relationship.

The many features and advantages of the invention are apparent from the detailed specification, and thus, it is intended by the appended claims to cover all such features and advantages of the invention which fall within the true spirit and scope of the invention. Further, since numerous modifications and variations will readily occur to those skilled in the art, it is not desired to limit the invention to the exact construction and operation illustrated and described, and accordingly, all suitable modifications and equivalents may be resorted to, falling within the scope of the invention.

What is claimed is:

1. A method for providing an interactive user interface for a user to specify one or more familial relationships between regions using a computer, comprising the steps of:
   (a) inputting, by the user, a network model including one or more relationships within at least one of the regions and/or across at least two of the regions;
   (b) defining, by the user, at least one multiplicity relationship for the network model, including the one or more familial relationships within the at least one of the regions and/or across the at least two of the regions using one or more familial indices, and assigning an index number to each of the one or more indices; and
   (c) simulating, by the computer, the network model in accordance with the defining step in (b), and outputting simulation results responsive thereto.

2. A method in accordance with claim 1, wherein said defining step (b) further comprises the steps of:
   (1) defining a root region in the network model; and
   (2) assigning the index number to each of the one or more indices responsive to a number of links between the root region and at least one of the regions.

3. A method according to claim 1, wherein said inputting step (a) further comprises the step of inputting, by the user, the network model including the one or more relationships within the at least one of the regions and/or across the at least two of the regions, wherein the regions comprise one or more entities.

4. A method according to claim 1, wherein said defining step (b) further comprises the step of defining the one or more familial relationships using first connections between elements within the at least one of the regions and/or second connections across the at least two of the regions using the one or more familial indices.

5. A method according to claim 1, wherein said defining step (b) further comprises the step of defining the one or more familial relationships using first connections between elements within the at least one of the regions and/or second connections across the at least two of the regions using the one or more familial indices, the first and second connections representing at least one of physical and logical connections.

6. A method according to claim 1, wherein said defining step (b) further comprises the step of defining the one or more familial relationships indicating a relationship between the regions, and not between elements within the regions.

7. A method according to claim 1, further comprising the step of averaging the simulation of the network model responsive to the at least one multiplicity relationship including the one or more familial relationships using the one or more familial indices.

8. A method according to claim 1, further comprising the step of averaging the simulation of the network model with respect to at least one of network utilization, network response time, network queue size, and network performance, responsive to the at least one multiplicity relationship including the one or more familial relationships using the one or more familial indices.

9. The method according to claim 1, wherein said regions generally consist solely of nodes.

10. A method of providing an interactive user interface for a user to specify one or more familial relationships between regions using a computer, comprising the steps of:
   (a) prompting, by the computer, the user to enter a network model;
   (b) inputting, by the user, the network model including one or more relationships within at least one of the regions and/or across at least two of the regions;
   (c) prompting, by the computer, the user to enter at least one multiplicity relationship;
   (d) inputting, by the user, the at least one multiplicity relationship for the network model;
   (e) prompting, by the computer, the user to enter the one or more familial relationships;
   (f) inputting, by the user, the one or more familial relationships within the at least one of the regions and/or across the at least two of the regions using familial indices; and
   (g) translating, by the computer, the network model, the at least one multiplicity relationship and the one or more familial relationships input from the user in said inputting steps (b), (d) and (f), and generating a simulation routine responsive thereto;
   (h) simulating, by the computer, the simulation routine and outputting simulation results responsive thereto; and
   (i) formatting, by the computer, the simulation results and presenting to the user for analysis.

* * * * *